US012645308B2

(12) United States Patent
Lee et al.

(10) Patent No.: US 12,645,308 B2
(45) Date of Patent: Jun. 2, 2026

(54) DIGITAL PEN AND PORTABLE ELECTRONIC DEVICE INCLUDING SAME

(71) Applicant: Samsung Electronics Co., Ltd., Suwon-si (KR)

(72) Inventors: Sangyup Lee, Suwon-si (KR); Hyunwoo Kwon, Suwon-si (KR); Huijun Ahn, Suwon-si (KR); Jiwoo Lee, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 362 days.

(21) Appl. No.: 18/222,148

(22) Filed: Jul. 14, 2023

(65) Prior Publication Data

US 2023/0359289 A1 Nov. 9, 2023

Related U.S. Application Data

(63) Continuation of application No. PCT/KR2021/015437, filed on Oct. 29, 2021.

(30) Foreign Application Priority Data

Jan. 14, 2021 (KR) ........................ 10-2021-0005381

(51) Int. Cl.
*G06F 3/0354* (2013.01)
*H05K 5/00* (2025.01)

(52) U.S. Cl.
CPC ....... *G06F 3/03545* (2013.01); *H05K 5/0086* (2013.01)

(58) Field of Classification Search
CPC .............. G06F 3/03545; G06F 3/0383; G06F 3/04162; G06F 3/016; H05K 5/0086
See application file for complete search history.

(56) References Cited

U.S. PATENT DOCUMENTS 8,638,191 B2 * 1/2014 Hamel ................... A61B 17/00
606/147
9,395,862 B2 7/2016 Kim
(Continued)

FOREIGN PATENT DOCUMENTS

JP H1031545 A 2/1998
JP 2006163652 A 6/2006
(Continued)

OTHER PUBLICATIONS

International Search Report and Written Opinion for International Application No. PCT/KR2021/015437; International Filing Date Oct. 29, 2021; Date of Mailing Feb. 3, 2022; 60 Pages.
(Continued)

*Primary Examiner* — Temesghen Ghebretinsae
*Assistant Examiner* — Ivelisse Martinez Quiles
(74) *Attorney, Agent, or Firm* — CANTOR COLBURN LLP

(57) ABSTRACT

A digital pen includes a housing, a pen tip exposed through an end of the housing, a rod extending from the pen tip into the housing, a resonance circuit and a control bar. The resonant circuit includes a coil to generate an electric current by a first signal, a resonance capacitor for discharging the accumulated electric charge to the coil such that the coil generates a second signal, and a variable capacitor for changing the resonance frequency of the second signal depending on pressure transferred from the pen tip through the rod. The control bar is movable from a first position, in which the control bar does not surround the coil, to a second position, in which the control bar surrounds a part of the coil, and has a metallic part to change the resonance frequency of the second signal.

15 Claims, 26 Drawing Sheets

< N mode >

< F mode >

(56)　　　　　References Cited

U.S. PATENT DOCUMENTS

| | | | |
|---|---|---|---|
| 9,927,889 | B2 | 3/2018 | Oda et al. |
| 10,459,538 | B2 | 10/2019 | Peretz et al. |
| 10,466,862 | B2 | 11/2019 | Kim et al. |
| 10,901,534 | B2 | 1/2021 | Shirai |
| 2008/0180092 | A1 | 7/2008 | Fukushima et al. |
| 2008/0278443 | A1* | 11/2008 | Schelling ........... G06F 3/03545 |
| | | | 345/157 |
| 2012/0068975 | A1 | 3/2012 | Wei et al. |
| 2014/0218338 | A1* | 8/2014 | Kim ................... G06F 3/03545 |
| | | | 345/174 |
| 2014/0253520 | A1* | 9/2014 | Cueto ................ G06F 3/03545 |
| | | | 345/179 |
| 2016/0162049 | A1 | 6/2016 | Horie et al. |
| 2016/0313812 | A1 | 10/2016 | Katsurahira |
| 2016/0378211 | A1* | 12/2016 | Kim ........................ G06F 3/038 |
| | | | 345/173 |
| 2016/0378217 | A1* | 12/2016 | Kim ................... G06F 3/04847 |
| | | | 345/173 |
| 2017/0097696 | A1 | 4/2017 | Park et al. |
| 2017/0185173 | A1* | 6/2017 | Ito ........................... G06F 3/041 |
| 2018/0181223 | A1 | 6/2018 | Yamada et al. |
| 2019/0227704 | A1 | 7/2019 | Kuo |
| 2020/0310561 | A1* | 10/2020 | Connellan ........... G06F 3/03545 |
| 2021/0149272 | A1* | 5/2021 | Li ........................... H04N 23/55 |

FOREIGN PATENT DOCUMENTS

| | | | |
|---|---|---|---|
| JP | 2008186071 | A | 8/2008 |
| JP | 2019148923 | A | 9/2019 |
| KR | 20060104315 | A | 10/2006 |
| KR | 101325183 | B1 | 11/2013 |
| KR | 20160011177 | A | 1/2016 |
| KR | 20160072689 | A | 6/2016 |
| KR | 20160102170 | A | 8/2016 |
| KR | 20170001531 | A | 1/2017 |
| KR | 20170041013 | A | 4/2017 |
| KR | 102034052 | B1 | 10/2019 |
| KR | 20200031831 | A | 3/2020 |
| WO | 2017043214 | A1 | 3/2017 |

OTHER PUBLICATIONS

Korean Office Action Issued in KR Application No. 10-2021-0005381; Mail Date Jan. 17, 2025; 9 Pages.

* cited by examiner

FIG. 1

< F mode >

< N mode >

INPUT DISTRIBUTION GRAPH – F3 MODE

<N MODE>　　　　　　　　<F MODE>

1200

1222

1230

1220

1270

1260

1221

1210

DIGITAL PEN AND PORTABLE ELECTRONIC DEVICE INCLUDING SAME

CROSS-REFERENCE TO RELATED APPLICATION(S

This application is a continuation application, claiming priority under § 365(c), of International Application No. PCT/KR2021/015437 filed on Oct. 29, 2021, which is based on and claims the benefit of Korean patent application number 10-2021-0005381 filed on Jan. 14, 2021, in the Korean Intellectual Property Office, the disclosures of which are incorporated by reference herein in their entireties.

TECHNICAL FIELD

Various embodiments of the disclosure relate to an electro-magnetic resonance (EMR) type digital pen and, more particularly, to a digital pen having a structure configured to change a resonant frequency of a magnetic field signal output from the digital pen and a portable electronic device having the same.

BACKGROUND ART

When a current flows via a coil of a sensor panel (e.g., a digitizer) of an electronic device (e.g., a smartphone), a first magnetic field signal may be produced in the coil. A current may be induced in a coil of an input device (a digital pen) adjacent to the electronic device by the first magnetic field signal. The induced current may cause charge to accumulate in a capacitor of the input device. The charge accumulated in the capacitor of the input device is discharged, and thus a second magnetic field signal (input signal) induced by the first magnetic field signal may be produced in the coil of the input device. In a state where the current is blocked by the coil of the sensor panel, an induced electromotive force may be produced in the coil of the sensor panel by an input signal produced by the coil of the input device. The electronic device may determine the position of the input device based on the production of induced electromotive force.

DISCLOSURE OF INVENTION

Technical Problem

A digital pen may provide data, such as pressure applied to a pen tip or pressure input to a button installed on the pen, to an electronic device via a change in the resonant frequency of an input signal.

When pressure is applied to the pen tip, a capacitance (C) of a variable capacitor provided in the digital pen and connected to a coil increases, thereby lowering the resonant frequency of the input signal from F0 ($=1/(2\pi\sqrt{LC})$) to F1. F1 may be defined as the resonant frequency representing a state in which no pressure is applied to the pen tip. A processor of the electronic device may recognize the amount of change (Df) ($=$F1–F0) of the resonant frequency and determine the pressure applied to the pen tip (hereinafter, referred to as pen pressure) from the recognized amount of change. Pen pressure, for example, may be used to express a line thickness drawn virtually by the pen. For example, the higher the pen pressure is, the greater the line thickness is described.

The characteristics of a resonant circuit, the material characteristics of a pen tip, or the dimensions of a housing forming the exterior of a pen may be different from pen to pen. Due to such deviation, an amount of change in the resonant frequency and the pen pressure value, which is calculated based thereon, may be different from pen to pen, even though the load (force or weight applied to the pen tip) is the same. For example, a load (minimum or turn-on load) for an electronic device to initially recognize the pen pressure and a load (maximum load) for the electronic device to recognize the maximum pen pressure may be different for each pen. Accordingly, some digital pens may show thick lines even if pressed lightly, and some digital pens may be pressed forcibly, but the line thickness may be expressed thinly.

An electronic device may provide a menu, via a display, for configuring a line thickness from a thin level to a relatively thick level. In a use case of a digital pen, although there may be variations from person to person, adjusting the line thickness by frequently changing the thickness via a menu may be quite cumbersome.

Various embodiments of the disclosure may provide a digital pen that is configured to allow a user to mechanically adjust sensitivity with respect to pen pressure or a portable electronic device having the same. Accordingly, when the line drawn virtually by the digital pen is expressed thinner or thicker than the user's desired thickness, the user is able to adjust the sensitivity so that the desired thickness of the line appears. In particular, the user is able to directly adjust the thickness of the line whenever necessary without using the configuration menu.

The technical problem to be achieved in the disclosure is not limited to the technical problem mentioned above, other technical problems not mentioned will be clearly understood by a person skilled in the art to which the disclosure belongs from the description below.

Solution to Problem

In various embodiments, a digital pen (e.g., the digital pen 201) may include: a housing, a pen tip exposed to the outside through an end of the housing, a rod extending from the pen tip into the housing along a longitudinal axis extending from the one end of the housing to the other end thereof, a resonant circuit and a control bar. The resonant circuit includes a coil received inside the housing, wound multiple times around the longitudinal axis in a direction in which the longitudinal axis extends, and producing an electric current by a first magnetic field signal from the outside, a resonant capacitor configured to accumulate an electric charge by the electric current produced in the coil, and to discharge the accumulated electric charge to the coil such that the coil produces a second magnetic field signal, and a variable capacitor configured to change the resonant frequency of the second magnetic field signal produced by the coil according to the pressure transferred from the pen tip via the rod. The control bar is shaped to surround the longitudinal axis, is movable from a first position at which the control bar does not surround the coil to a second position at which the control bar surrounds at least a part of the coil, and includes a metallic part to change the resonant frequency of the second magnetic field signal produced by the coil.

In various embodiments, a portable electronic device (e.g., the electronic device 101 of FIG. 1) may include: the digital pen, a housing having a space configured to receive the digital pen, a sensor panel configured to produce a first magnetic field signal and receive a second magnetic field signal from the digital pen, and a processor configured to obtain a pressure, based on the resonant frequency of the second magnetic field signal received from the digital pen via the sensor panel.

Advantageous Effects of Invention

In various embodiments of the disclosure, a user may be provided with a digital pen configured to adjust the sensitivity to produce a desired line thickness when a line is expressed thinner or thicker than the user wants. In addition, various effects identified directly or indirectly via the disclosure may be provided.

BRIEF DESCRIPTION OF DRAWINGS

FIG. 1 is a block diagram of an electronic device in a network environment, according to various embodiments;

MODE FOR THE INVENTION

Figure 1:
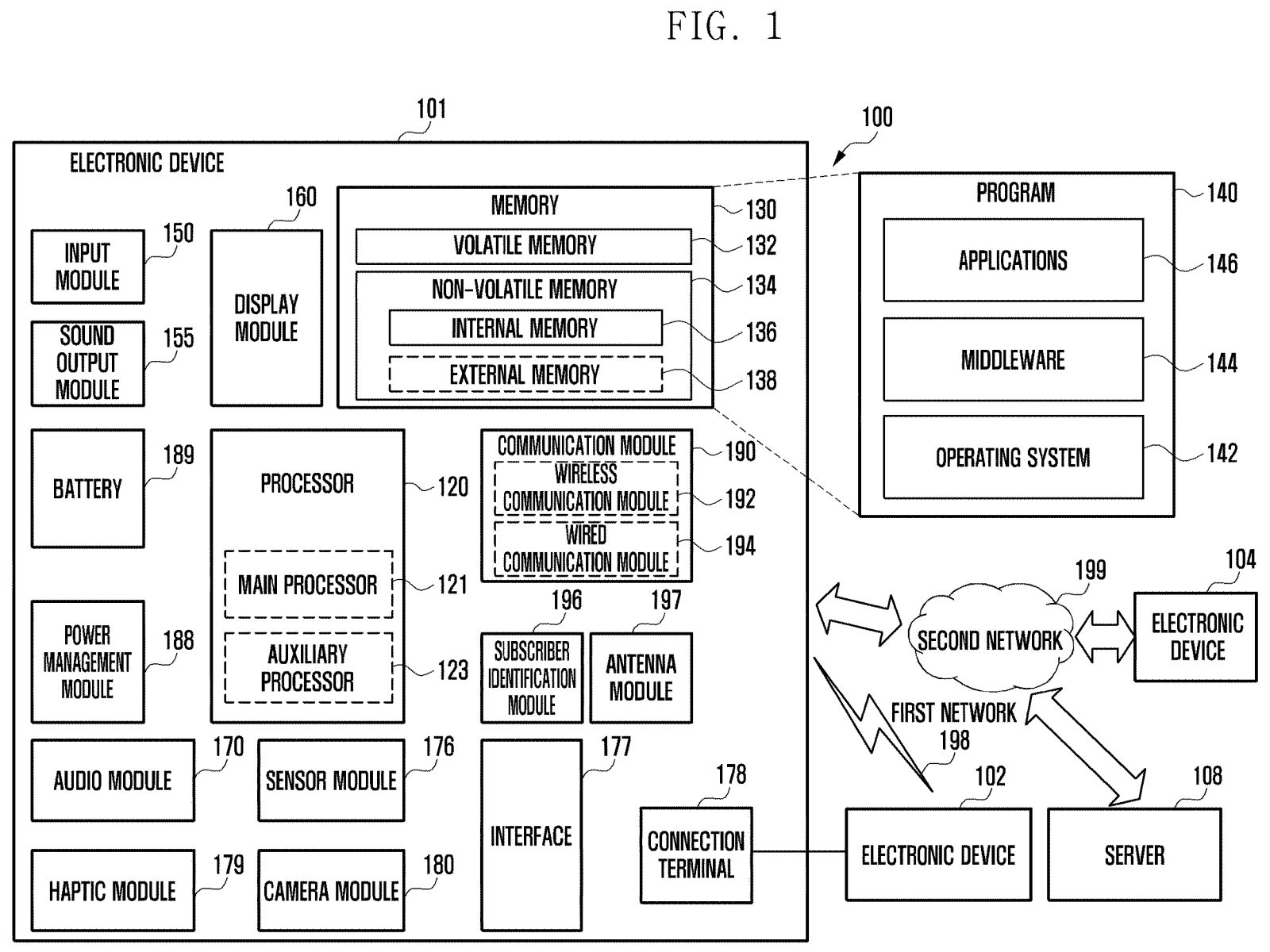
Figure 2:
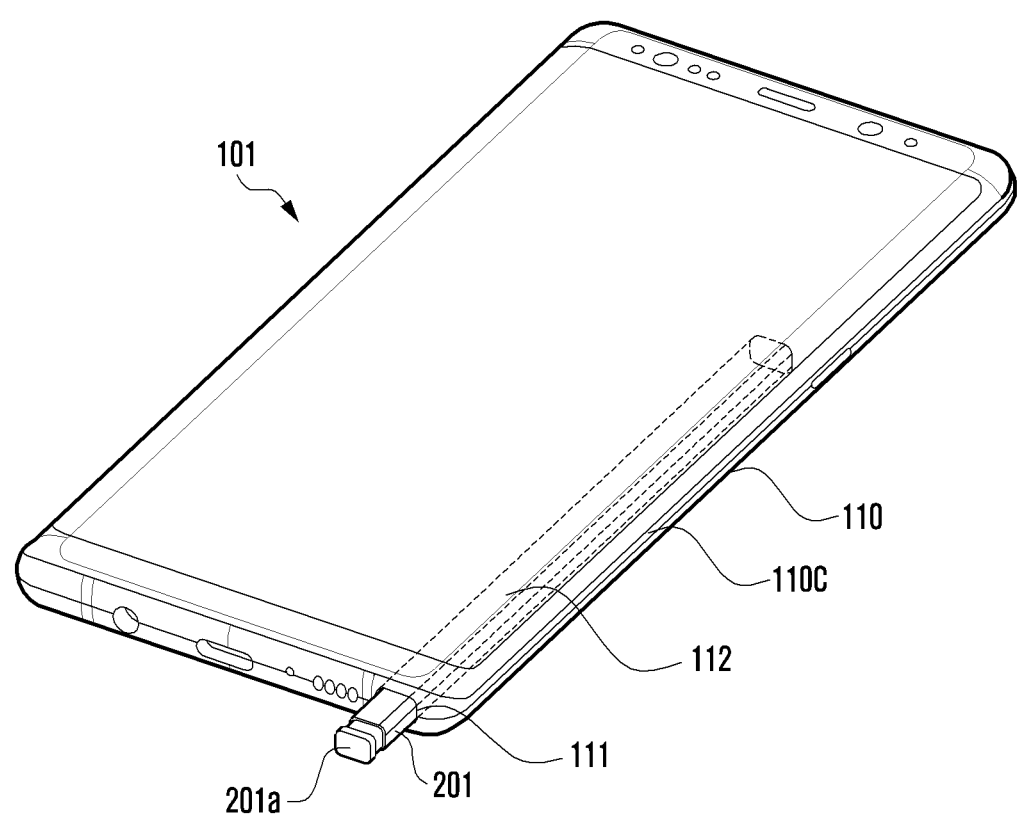
FIG. 2 is a view showing the outer appearance of an electronic device including a digital pen, according to an embodiment.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connection terminal 178, a haptic module 179, a camera module 180, a power management module 188, a battery 189, a communication module 190, a subscriber identification module (SIM) 196, or an antenna module 197. In some embodiments, at least one of the components (e.g., the connection terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thererto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, a pressure sensor adapted to measure the intensity of force incurred by the touch, or a sensor panel adapted to detect an input of a digital pen (e.g., digitizer).

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connection terminal 178 may include a connector via which the electronic device 101 may be physically connected with the external electronic device (e.g., the electronic device 102). According to an embodiment, the connection terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 3:
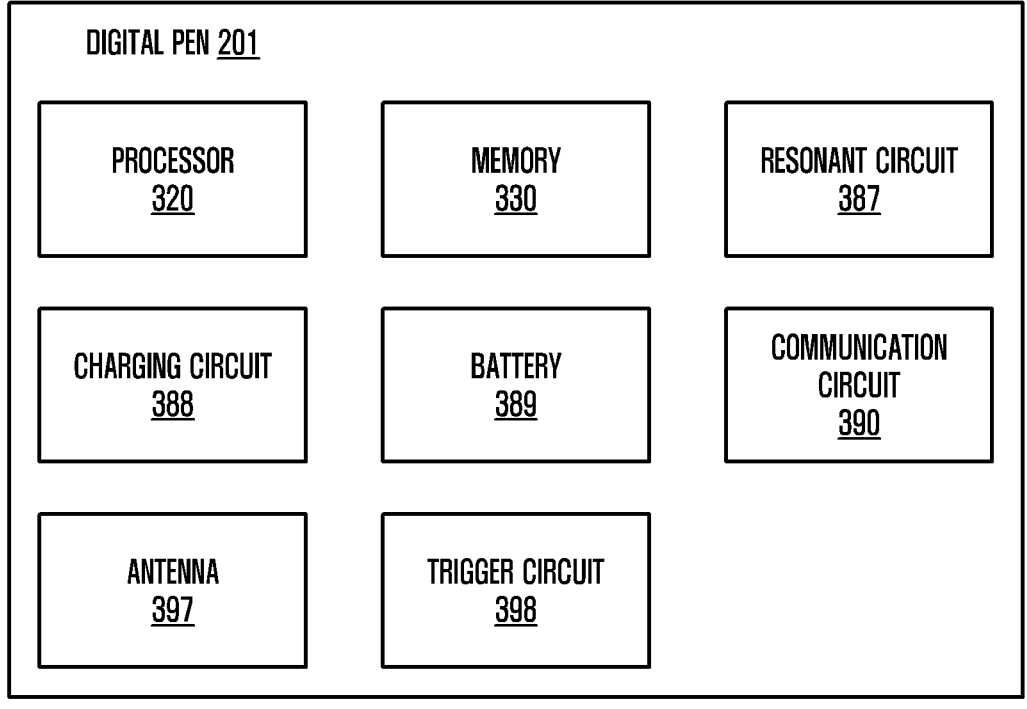
FIG. 3 is an electric block diagram of a digital pen, according to an embodiment.
Figure 4:
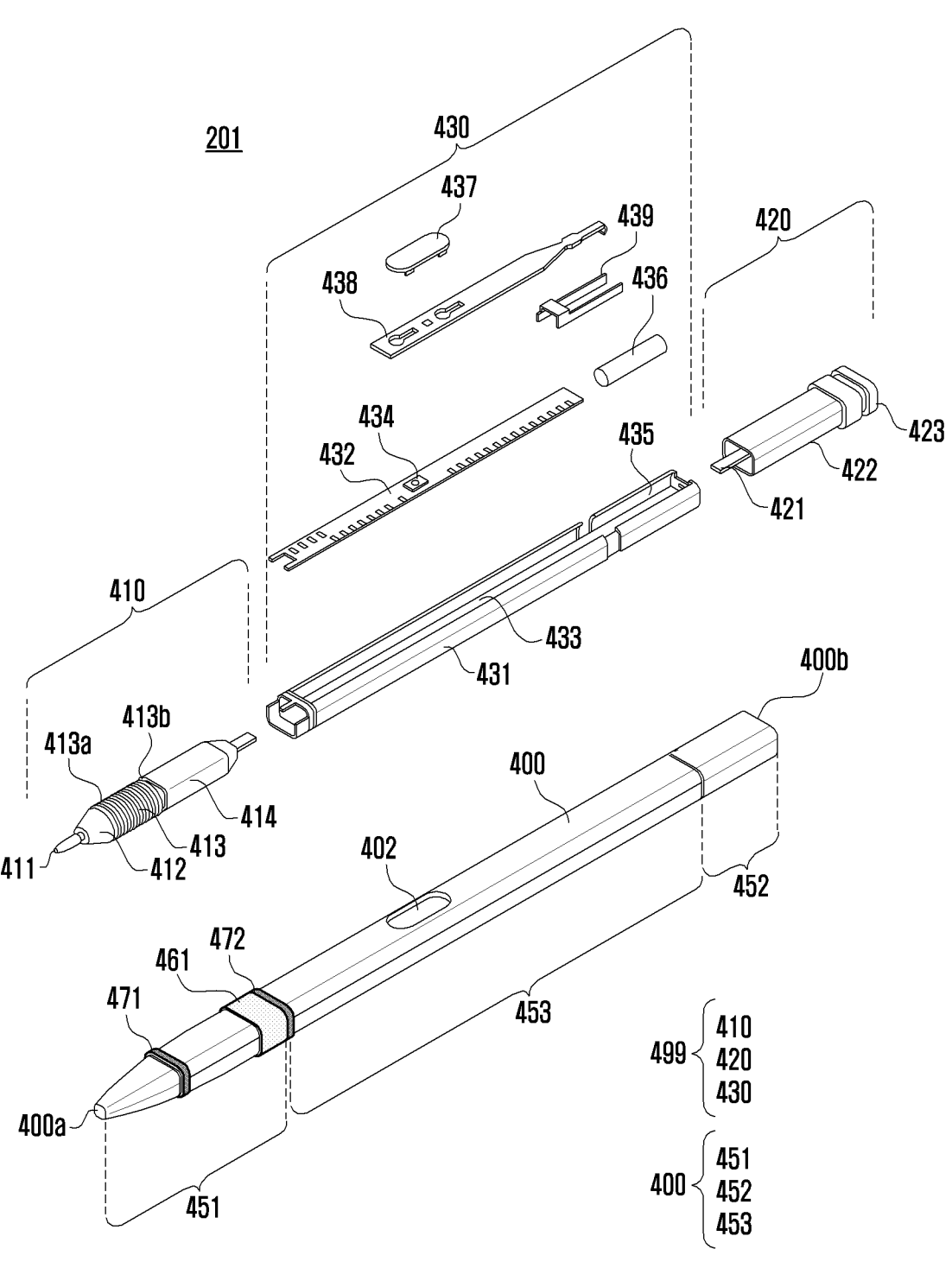
FIG. 4 is an exploded perspective view of a digital pen, according to an embodiment.

FIG. 2 is a view showing the outer appearance of an electronic device 101 including a digital pen, according to an embodiment. FIG. 3 is an electric block diagram of a digital pen, according to an embodiment. FIG. 4 is an exploded perspective view of a digital pen, according to an embodiment.

Referring to FIG. 2, the electronic device 101 may include a structure into which a digital pen 201 (e.g., the input module 150) is able to be inserted. For example, a hole 111 may be formed through a lateral surface 110C of a housing

110 forming an outer appearance of the electronic device 101. The digital pen 201 may be inserted into a reception space 112 formed inside the housing 110 through the hole 111. According to an embodiment, the digital pen 201 may include the button 201a, which is capable of being pressed, and which is configured to facilitate taking out the digital pen 201 from the reception space. The button 201a is formed at one end of the digital pen 201. When the button 201a is pressed, a repulsive mechanism (e.g., at least one spring) associated with the button 201a may be activated, and thus the digital pen 201 may be separated from the reception space 112. In an embodiment, the digital pen 201 may be implemented as an attachment type rather than an insertion type as shown. For example, the digital pen 201 may include a magnet or adhesive. A reception space may not be provided in the electronic device 101, and instead, a part of the housing 110 (e.g., a part of a lateral surface or a rear surface) may be made of metal or of a material to which the adhesive can adhere. Thus, in these or other cases, the digital pen 201 may be magnetically or adhesively attached to the electronic device 101.

Referring to FIG. 3, the digital pen 201 according to an embodiment may include a processor 320, a memory 330, a resonant circuit 387, a charging circuit 388, a battery 389, a communication circuit 390, an antenna 397, and/or a trigger circuit 398. The processor 320 can be provided at least a part of the resonant circuit 387, or can be provided at least as a part of the communication circuit 390 and may be configured on a printed circuit board (PCB) or in a form of a chip. The elements of the digital pen 201 may be operatively or electrically connected to each other. Other elements except for the resonant circuit 387 may be omitted from the configuration of the digital pen 201.

The processor 320 may include a generic processor configured to execute a customized hardware module or software (e.g., an application program). The processor may include a software element (program) or a hardware element (function) including at least one of various sensors provided in the digital pen 201, a data measurement module, an input/output interface, a module which manages the state or environment of the digital pen 201, or a communication module. The processor 320 may include, for example, one or a combination of two or more of hardware, software, or firmware. According to an embodiment, the processor 320 may recognize, via the resonant circuit 387, that a sensor panel (e.g., a digitizer) of the electronic device 101 is close thereto. When proximity is recognized, the processor 320 may control the resonant circuit 387 to transmit an input signal to the electronic device 101. For example, the processor 320 may transmit sensor data and communication state information obtained by the communication circuit 390 and charging activation and charging state information obtained by the charging circuit 388 by including the same in an input signal.

The memory 330 may include information related to an operation of the digital pen 201. For example, the information may include power control information for charging the battery 389, information for communication with the electronic device 101, or frequency information related to an input operation of the digital pen 201.

The resonant circuit 387 may include at least one of a coil, an inductor, and a capacitor. The resonant circuit 387 may be configured to produce an input signal having a resonant frequency used for the electronic device 101 to recognize the position and pen pressure of the digital pen 201. For example, in order to produce an input signal, the digital pen 201 may use an electro-magnetic resonance (EMR) method, an active electrostatic (AES) method, and/or an electrically coupled resonance (ECR) method. When the digital pen 201 transmits a signal by the EMR method, for example, the digital pen 201 may produce an input signal based on an electromagnetic field produced from a sensor panel of the electronic device 101. When the digital pen 201 transmits a signal by the AES method, as another example, the digital pen 201 may generate an input signal using the electronic device 101 and capacitance coupling. When the digital pen 201 transmits a signal by the ECR method, as yet another example, the digital pen 201 may produce an input signal based on an electric field produced from a capacitive device of an electronic device. According to an embodiment, the resonant circuit 387 may be used to change the strength or frequency of the electromagnetic field according to a user's operation status. For example, the resonant circuit 387 may output an input signal having a resonant frequency for recognizing a hovering input, a drawing input, a button input, and/or an erasing input to the electronic device 101.

The charging circuit 388 may include a rectifier for rectifying an alternating current (AC) signal produced by the resonant circuit 387 into a direct current (DC) signal and a regulator (e.g., a low dropout (LDO) regulator) which converts a DC signal (input voltage) into a constant charging voltage and outputs the DC signal to the battery 389. According to an embodiment, based on the voltage level of the DC signal produced by the charging circuit 300, the digital pen 201 may identify whether the digital pen 201 is inserted into the electronic device 101. The digital pen 201 may determine whether the sensor panel is close thereto and whether the digital pen 201 is attached in the charging position, based on the voltage level of a DC signal.

The battery 389 may be configured to store power required for the operation of the digital pen 201. The battery may include, for example, a lithium-ion battery or a capacitor, and may be rechargeable or replaceable. According to an embodiment, the battery 389 may be charged using power (e.g., DC signal (DC power)) provided from the charging circuit 388.

The communication circuit 390 may be configured to perform wireless communication between the digital pen 201 and the communication module 190 of the electronic device 101. According to an embodiment, the communication circuit 390 may transmit state information and input information of the digital pen 201 to the electronic device 101 using a short-range communication method. For example, the communication circuit 390 may transmit direction information (e.g., motion sensor data) of the digital pen 201 obtained by the trigger circuit 398, voice information input via a microphone, and/or remaining amount information of the battery 389 to the electronic device 101. As an example, the short-range communication method may include at least one of Bluetooth™, Bluetooth™ Low Energy (BLE), and/or a wireless local area network (LAN).

The antenna 397 may be used to transmit or receive a signal or power to or from the outside (e.g., an exterior of the electronic device 101). According to an embodiment, the digital pen 201 may include a plurality of antennas 397, and may select at least one antenna 397 suitable for a communication method from among the plurality of antennas 397. Via the selected antenna 397, the communication circuit 390 may exchange signals or power with an external electronic device.

The trigger circuit 398 may include at least one of a button circuit and/or a sensor circuit. According to an embodiment, the processor 320 may identify the input method (e.g., touch or pressed) or type (e.g., EMR button or BLE button) of the button 201a of the digital pen 201. According to an embodiment, the sensor circuit may produce an electrical signal or data value corresponding to an internal operating state of the digital pen 201 or an external environmental state. For example, the sensor circuit may include at least one of a motion sensor, a battery level detection sensor, a pressure sensor, a light sensor, a temperature sensor, a geomagnetic sensor, and a biometric sensor. According to an embodiment, the trigger circuit 398 may transmit a trigger signal to the electronic device 101 using a button input signal or a sensor signal.

Referring to FIG. 4, the digital pen 201 may include a housing 400 forming an external pen shape and an assembly 499 mounted therein. Multiple elements may be coupled into one assembly 499 and be inserted into the housing 400.

The housing 400 may have an elongate or straightly extending shape. A receiving space configured to receive the assembly 499 may be formed in the housing 400. The housing 400 may have, but is not limited to, an elliptical cross section, and, in these or other cases, may have an elliptical columnar shape. In these or other cases, the receiving space may also have an elliptical cross section to correspond to the shape of the housing 400. The housing 400 may be implemented with a synthetic resin (e.g., plastic) and/or a metallic material (e.g., aluminum). According to an embodiment, a first end 400a of the housing 400 may be made of a synthetic resin material.

The assembly 499 may have an elongate or straightly extending shape to correspond to the shape of the housing 400. The assembly 499 may be divided into three parts along a longitudinal axis (an imaginary straight line) extending from the first end 400a to the second end 400b. For example, when viewed in a state of being received inside the housing 400, the assembly 499 may include a first assembly member (or, a coil member) 410 disposed adjacent to the first end 400a, a second assembly member (or, an ejection member) 420 disposed adjacent to the second end 400b, and a third assembly member (or, a PCB member) 430 disposed between the first assembly member 410 and the second assembly member 420.

The first assembly member 410 may include a pen tip 411, which is exposed to the outside or exterior of the first end 400a when the assembly 499 is completely inserted into the housing 400, a packing ring 412, a coil 413 wound multiple times around the longitudinal axis directed from the first end 400a to the second end 400b, and a pressure sensor 414, which is configured to detect the pressure applied to the pen tip 411. The packing ring 412 may include epoxy, rubber, urethane, and/or silicone. The packing ring 412 may be provided for the purpose of waterproofing and dustproofing, and may protect the first assembly member 410 and the third assembly member 430 from submersion in liquid or gas and/or from dust. According to an embodiment, the coil 413 may produce an induced current by a first magnetic field signal output from an external electronic device (e.g., the electronic device 101). A resonant capacitor (e.g., a component of the third assembly member 430) may be charged by the induced current. The charge accumulated in the resonant capacitor through charging may be discharged to the coil 413, and thus an input signal (a second magnetic field signal) may be output to the external electronic device. The pressure sensor 414 may include a device (e.g., a variable capacitor) configured to change a resonant frequency of an input signal output to the external electronic device by pen pressure applied to the pen tip 411. A processor (e.g., the processor 120) of the external electronic device may obtain pen pressure based on the resonant frequency of an input signal (a magnetic field signal) received by the sensor panel.

The second assembly member 420 may include an element for extracting the digital pen 201 from the reception space 112 of the electronic device 101. According to an embodiment, the second assembly member 420 may include a shaft 421, a body 422 surrounding at least a part of the shaft 421 and forming an overall appearance of the second assembly member 420, and a button 423 (e.g., 201*a* in FIG. 2). The shaft 421 and the body 422 may be inserted into the housing 400 and the button 423 may be exposed to the outside or exterior through the second end 400*b*. Although not shown, by arranging a plurality of parts, for example, cam members or elastic members inside the body 422, the second assembly member 420 may be implemented in a push-pull structure. For example, the button 423 may perform linear reciprocating motion using the shaft 421 as an axis. According to an embodiment, an engaging structure may be formed on the button 423 so that a user may take out the digital pen 201 using a fingertip or a fingernail. According to an embodiment, the digital pen 201 may include a sensor which detects a linear reciprocating motion of the button 423, and thus provide another input method. When the digital pen 201 is implemented as an attachment type, the second assembly member 420 may be configured without the above-described elements. For example, the second assembly member 420 may be a structure which seals the second end 400*b*.

The third assembly member 430 may include a base 431, a PCB 432 having at least one surface that is surrounded by the base 431, and an antenna (not shown). According to an embodiment, a substrate seating portion 433 on which the PCB 432 is disposable may be formed on an upper surface of the base 431. The PCB 432 may be fixed in place while the PCB 432 is seated on the substrate seating portion 433. According to an embodiment, a switch 434 or a capacitor connected to the coil 413 may be disposed on the upper surface of the PCB 432, and a charging circuit, a battery, or a communication circuit may be disposed on a lower surface thereof. The battery may include an electric double layered capacitor (EDLC) or a lithium-ion battery. The charging circuit may be located between the coil 413 and the battery, and may include a regulator, voltage detector circuitry, and a rectifier.

The antenna may include an antenna structure 439 as shown in FIG. 4 and/or an antenna embedded on the PCB 432. A side button 437 provided on the digital pen 201 may be used to press the switch 434 and may be exposed to the outside or exterior through a lateral surface opening 402 of the housing 400. While the side button 437 is supported by a support member 438, if there is no external force acting on the side button 437, the support member 438 may provide elastic restoring force to restore or maintain the side button 437 in a state of being disposed at a predetermined position.

The third assembly member 430 may include other packing rings such as O-rings. For example, O-rings made of an elastic material may be arranged at opposite ends of the base 431 to form a sealing structure between the base 431 and the housing 400. In an embodiment, the support member 438 may partially come into close contact with an inner wall of the housing 400 around the lateral surface opening 402 to form a sealing structure. For example, the third assembly member 430 may also form a waterproof and dustproof structure similar to that of the packing ring 412 of the first assembly member 410.

The digital pen 201 may include a battery seating portion 435 in which a battery 436 is disposed on the upper surface of the base 431. The battery 436, which is mountable on the battery seating portion 435, may include, for example, a cylinder type battery.

The digital pen 201 may include a microphone (not shown). The microphone may be electrically connected to the PCB 432 or electrically connected to the PCB 432 via a flexible printed circuit board (FPCB) (not shown). According to an embodiment, the microphone may be disposed adjacent to the side button 437.

The housing 400 may be divided into three parts along a longitudinal axis connecting the first end 400*a* and the second end 400*b*. For example, the housing 400 may include a first housing portion 451 extending from the first end 400*a*, a second housing portion 452 extending from the second end 400*b*, and a third housing portion 453 disposed or interposed between the two housing portions 451 and 452. When viewed in a state where the assembly 499 is inserted into the inner receiving space, the first housing portion 451 may be a structure which surrounds the coil 413. The third housing portion 453 may be integrally formed with the first housing portion 451.

The digital pen 201 may include a member (hereinafter, a control bar) 461 which surrounds the circumference of the housing 400 around a longitudinal axis connecting the first end 400*a* and the second end 400*b*. The control bar 461 is movable along the longitudinal axis and has at least a part thereof that is made of metal. The control bar 461 may be of a ring or annular type. A portion of the first housing portion 451 on which the control bar 461 is moved may be in the form of a recess. The control bar 461 may move from a position where the control bar does not overlap the coil 413 to a position where the control bar overlaps at least a part of the coil 413. In other words, the control bar 461 may move from a position where the control bar does not surround the coil 413 to a position where the control bar surrounds at least a part of the coil 413. Accordingly, the resonant frequency of the input signal output from the coil 413 to the outside or exterior may change. For example, when the control bar 461 is moved from a position where the control bar does not surround the coil 413 (hereinafter, referred to as a normal (N) mode) to a position where the control bar surrounds at least a part of the coil 413 (hereinafter, referred to as a fine (F) mode), the control bar 461 (i.e., metal) may affect the resonance characteristics of the resonant circuit (e.g., the resonant circuit 287 of FIG. 2) and may cause a change in the inductance (L) of the resonant circuit. For example, L of the resonant circuit may reduce, and thus the resonant frequency of the input signal may be relatively increased. When assuming that the load applied to the pen tip 411 is the same, the resonant frequency may be relatively higher in the F mode than in the N mode. Accordingly, when expressing the thickness of pen writing in proportion to the amount of change in the resonant frequency of the input signal, an input signal reception device (e.g., the electronic device 101 in FIG. 1) may express a line with a smaller thickness in the F mode than in the N mode. The digital pen 201 may provide, to a user, a mode for manually adjusting line thickness via the control bar 461.

According to an embodiment, the digital pen 201 may include a structure limiting a range in which the control bar 461 is movable. For example, the digital pen 201 may include stoppers 471 and 472 which limit the movement range of the control bar 461 within the first housing portion 451. A first stopper 471 may be formed in a protruding shape on the outer circumference of the first housing portion 451 (e.g., the end portion adjacent to the second housing portion 452) adjacent to the first end 400*a*, and may thus prevent the control bar 461 from escaping to the outside of the digital pen 201 through the first end 400*a*. The first stopper 471 may be formed at a position substantially aligned with one end 413*a* of the coil 413. Accordingly, when the control bar 461 is in contact with the first stopper 471, the control bar 461 may surround the end of the coil 413. A second stopper 472 may be formed in a protruding shape on the outer circumference of the first housing portion 451 adjacent to the third housing portion 453, and may thus prevent the control bar 461 from moving beyond the first housing portion 451 to the third housing portion 453. When in contact with the control bar 461, the second stopper 472 may be formed at a position where the second stopper allows the control bar 461 to be spaced apart from the coil 413. Accordingly, when the control bar 461 is in contact with the second stopper 472, the control bar 461 may be spaced apart from the other end 413*b* of the coil 413 and be positioned at a location where the control bar does not overlap the coil 413. According to an embodiment, when the first stopper 471 is in contact with the control bar 461, the control bar 461 may be formed at a position where the control bar is allowed to escape from the coil 413. When the second stopper 472 is in contact with the control bar 461, the second stopper may be formed at a position where the second stopper overlaps the coil 413.

Figure 5:
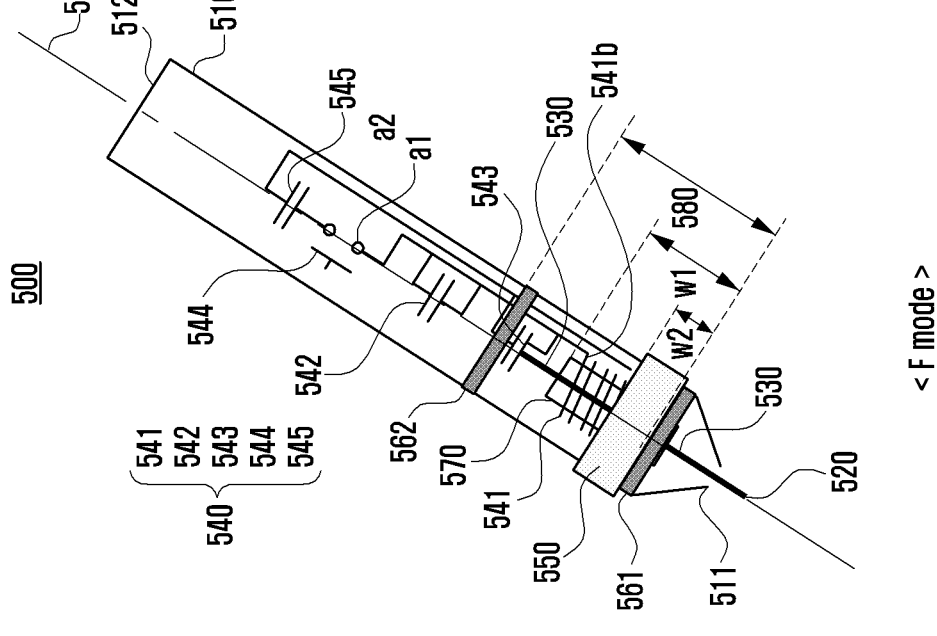
FIG. 5 illustrates a structure of a digital pen in normal and fine modes, according to an embodiment.
Figure 5:
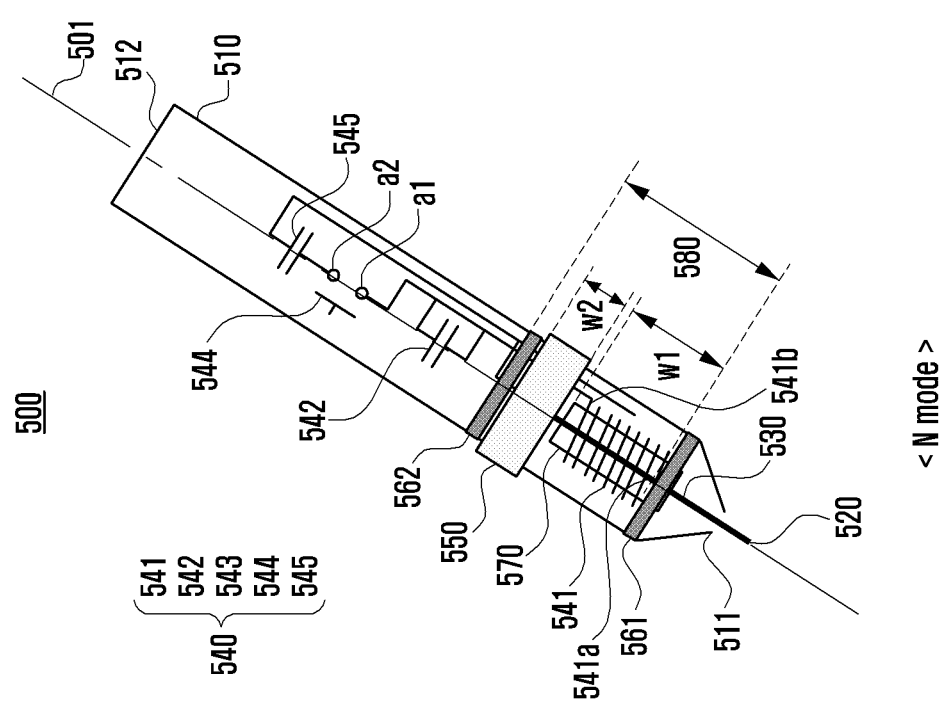
Figure 6A:
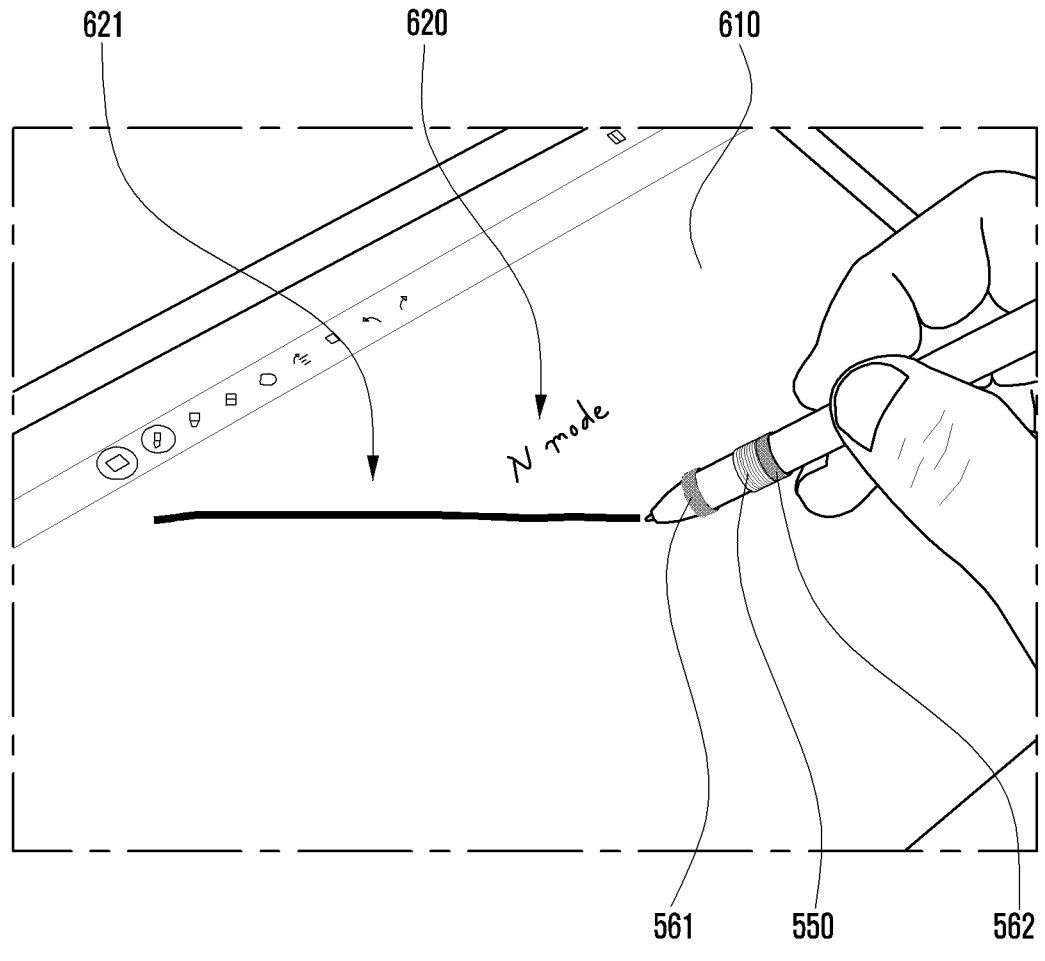
FIG. 6A and FIG. 6B are views showing pen writing in a normal (N) mode and pen writing in a fine (F) mode.
Figure 6B:
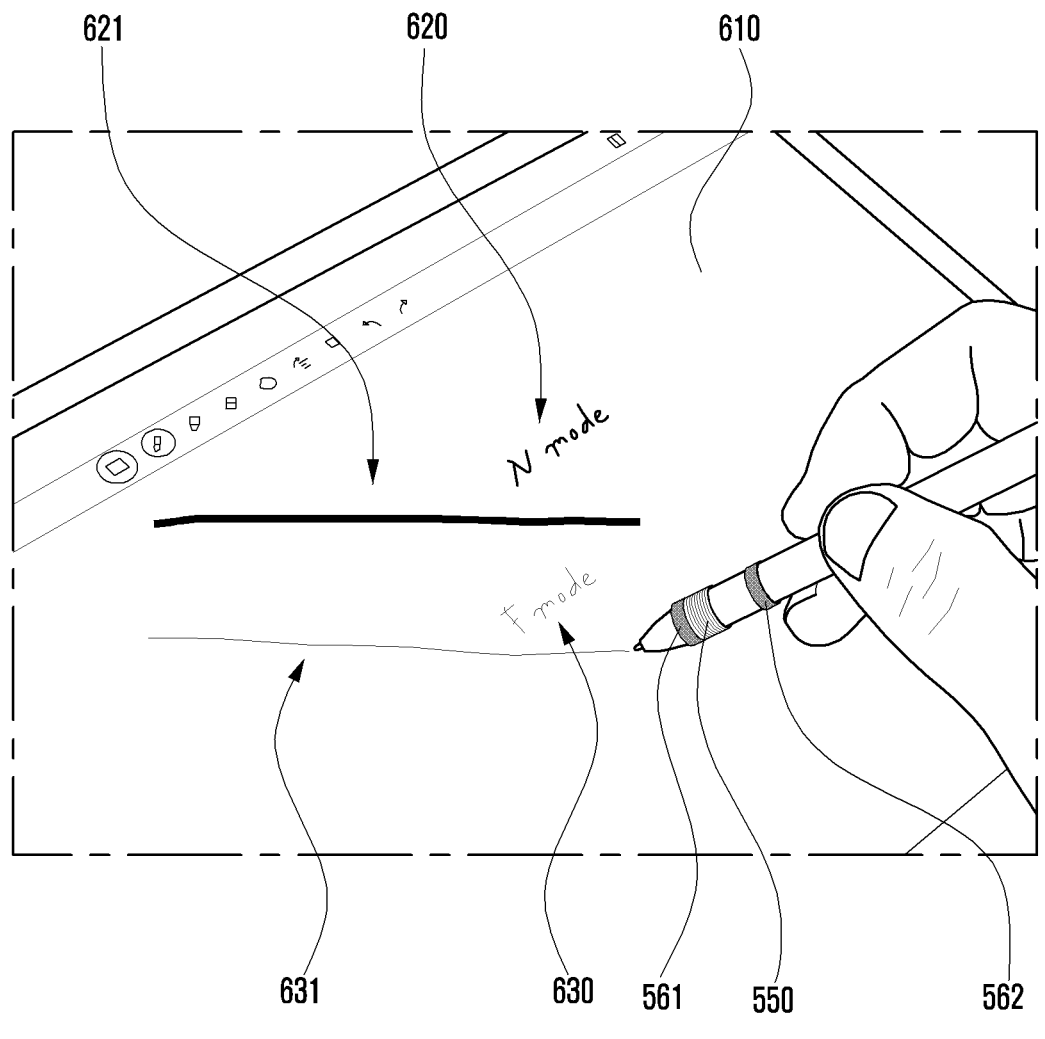

FIG. 5 illustrates a structure of a digital pen 500, according to an embodiment. FIG. 6A and FIG. 6B are views showing pen writing in the N mode of FIG. 5 and pen writing in the F mode of FIG. 5, respectively. Referring to FIG. 5, the digital pen 500 (e.g., the digital pen 201 of FIG. 2) may include a housing 510, a pen tip 520 exposed to the outside or exterior via one end 511 of the housing 510, a rod 530 extending from the pen tip 520 into the housing 510 along a longitudinal axis extending from one end 511 of the housing 510 to the other end 512 thereof, a resonant circuit 540 received inside the housing 510, and a control bar 550. The control bar 550 surrounds the housing 510 around a longitudinal axis 501, connects the one end 511 and the other end 512, is movable along the longitudinal axis 501, and has at least a part thereof that is made of metal.

The resonant circuit 540 may include a coil 541, a main capacitor 542, and a variable capacitor 543.

The coil 541 may be received inside the housing 510 and be wound around the longitudinal axis 501 in a direction in which the longitudinal axis 501 extends. Accordingly, a current may be induced in the coil 541 by a first magnetic field signal that is output from an external electronic device (e.g., the electronic device 101 of FIG. 1). The induced current may be stored in the main capacitor 542. In other words, electric charge may be accumulated in the main capacitor 542 by the current induced in the coil 541. The electric charge accumulated in the main capacitor 542 may be discharged to the coil 541, and thus a second magnetic field signal (an input signal) in a direction of the longitudinal axis 501 may be output from the coil 541. The external electronic device may acquire the strength of the second magnetic field signal received from each coil of the sensor panel, and obtain the position (e.g., xy coordinates) of the digital pen 500 using the intensity information obtained for each coil.

The variable capacitor 543 may be configured to vary the resonant frequency of the input signal by pressure transmitted from the pen tip 520 via the rod 530. For example, a first conductive member may be formed at an end of the rod 530. The first conductive member may be spaced apart from a second conductive member provided on one surface of a dielectric in the variable capacitor 543 and when pressure is applied to the pen tip 520, the first conductive member may be attached to the second conductive member. Together with the first conductive member, the second conductive member may be included in the first electrode of the variable capacitor 543. A third conductive member provided on the other surface of the dielectric may be included in a second electrode of the variable capacitor 543. The area of the first electrode may be changed according to the pen pressure, and thus the capacitance of the variable capacitor 543 may be changed. The resonant frequency of an input signal may be varied by such capacitance change.

The resonant circuit 540 may further include a switch 544 and a sub-capacitor 545 for changing the resonant frequency. When the two contact points (a1, a2), which are normally disconnected in the resonant circuit 540, are connected to each other by the switch 544 (e.g., the switch 434 in FIG. 4), the resonant frequency of an input signal may be changed by the sub-capacitor 545. An input signal reception device (e.g., the electronic device 101 in FIG. 1) may recognize the change in resonant frequency. The resonant frequency (F0) of an input signal produced by the main capacitor 542, the resonant frequency (F1) of an input signal produced by the variable capacitor 543, and the resonant frequency (F2) of an input signal produced by the sub-capacitor 545 may differ from each other.

The coil 541 and the variable capacitor 543 may be elements of the first assembly member 410 in FIG. 4. The main capacitor 542, the switch 544, and the sub-capacitor 545 may be elements of the third assembly member 430 in FIG. 4.

The control bar 550 may have a ring-shaped structure which surrounds a part of the housing 510 around the longitudinal axis 501 and is as least partially made of metal.

The control bar 550 is movable along the longitudinal axis 501. For example, referring to the image in the left side of FIG. 5, the control bar 550 may be positioned at a position where the control bar does not surround the coil 541. Referring to the image in the right side of FIG. 5, the control bar 550 may move to a position where the control bar surrounds a part of the coil 541.

In an embodiment, the control bar 550 may be a structure which surrounds the circumference of the housing 510 at 360 degrees. In another embodiment, the control bar 550 may be a structure which surrounds the circumference of the housing 510 at less than 360 degrees. For example, the control bar 550 may have a generally ring-shaped structure with a short circumferential segment removed.

The control bar 550 may come into close contact with or be tightly fit around the housing 510 so that the control bar 550 provides resistance to movement. Accordingly, even if the posture of the digital pen 500 changes in up and down directions, a position of the control bar 550 can be maintained without a user being responsible for holding the control bar 550 in place. When an external force exceeding the resistance is applied to the control bar 550, such as an intentional movement by the user, the control bar 550 may move.

The digital pen 500 may further include a first stopper 561 and a second stopper 562 as a structure which limits a range 580 in which the control bar 550 can move. The movement range 580 may be determined as a distance between an interior edge of the first stopper 561 and an opposite interior edge of the second stopper 562. The distance between the stoppers 561 and 562 and the positions of the stoppers 561 and 562 may be determined based on the position and width (w1) of the coil 541 and the width (w2) of the control bar 550. For example, the distance between the stoppers 561 and 562 (or the movement range 580) may be determined to the sum of w1 and w2 or a value greater than the sum of w1 and w2. The first stopper 561 may be formed at a position that is substantially aligned to be parallel with an end 541a closer to the one end 511 of the housing 510 among the two ends 541a and 541b of the coil 541. The second stopper 562 may be formed at a position that is spaced apart from the first stopper 561 by the predetermined value (e.g., w1+w2).

Referring to FIG. 6A, a user may place the control bar 550 in the N mode (e.g., a position where the control bar is in contact with the second stopper 562) in which the control bar does not surround the coil 541, and may perform writing (N mode; 620) and drawing (621) on a touch screen 610. The user may switch the mode of the control bar 550 to the F mode in which the control bar surrounds the coil 541 (e.g., the position where the control bar is in contact with the first stopper 561). Assuming that the control bar 550 is switched from N mode to the F mode, the inductance (L) of the resonant circuit 540 is reduced, and the load applied to the pen tip 520 is thus the same, the resonant frequency of the input signal may be relatively higher in the F mode than in the N mode. Therefore, referring to FIG. 6B, the thickness of the user's writing (F mode, 630) and drawing 631 in the F mode may be expressed relatively smaller.

With reference back to FIG. 5, the digital pen 500 may further include a core 570 made of metal or a metallic material (e.g., ferrite). The core 570 may have a cylindrical shape and extend along a direction of the longitudinal axis 501. The coil 541 may be wound around the outer circumference of the core 570. A hole may be formed inside the core 570 along the direction of the longitudinal axis 501, and thus the rod 530 may extend toward the variable capacitor 543 through the core and along the hole.

Figure 7A:
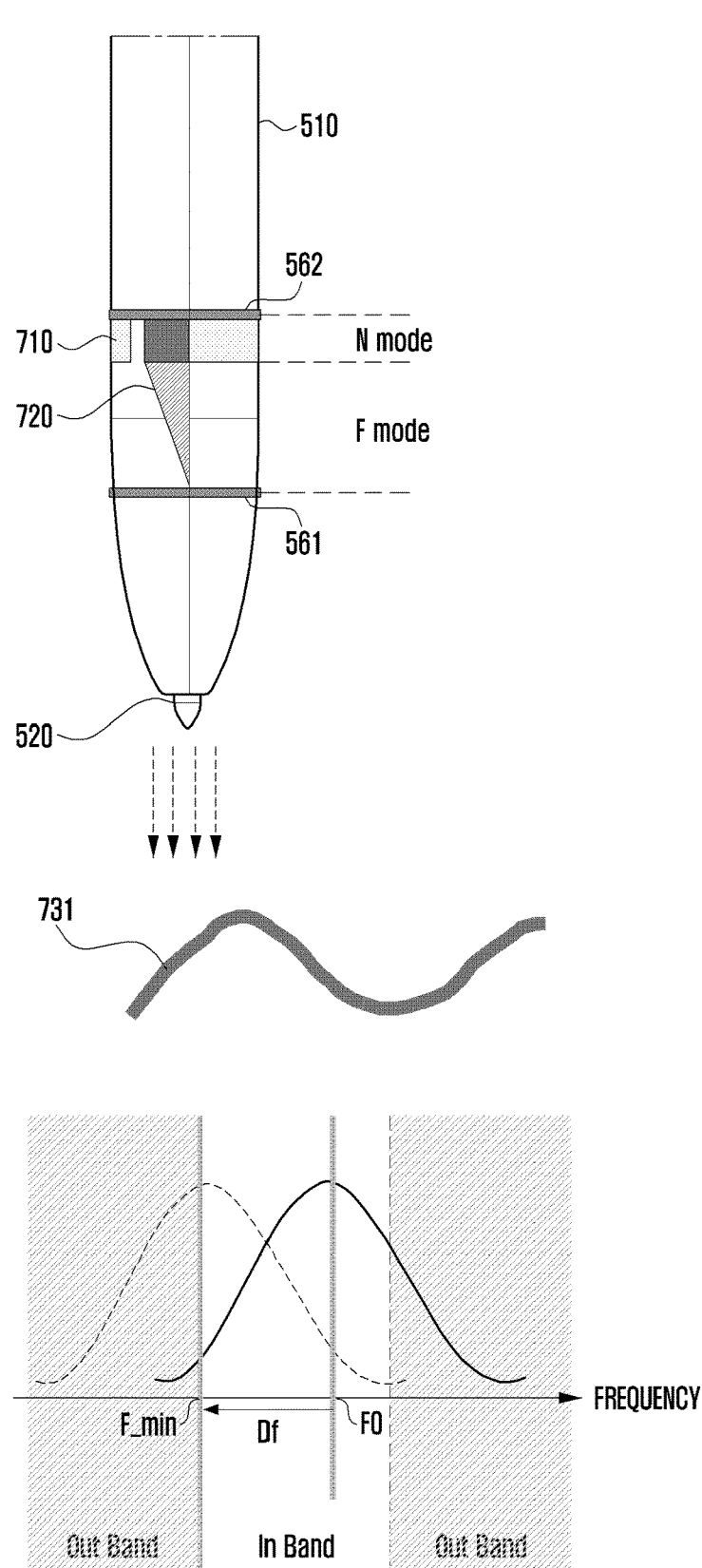
FIGS. 7A, 7B, and 7C illustrate resonant frequency variations in each mode of a control bar.
Figure 7B:
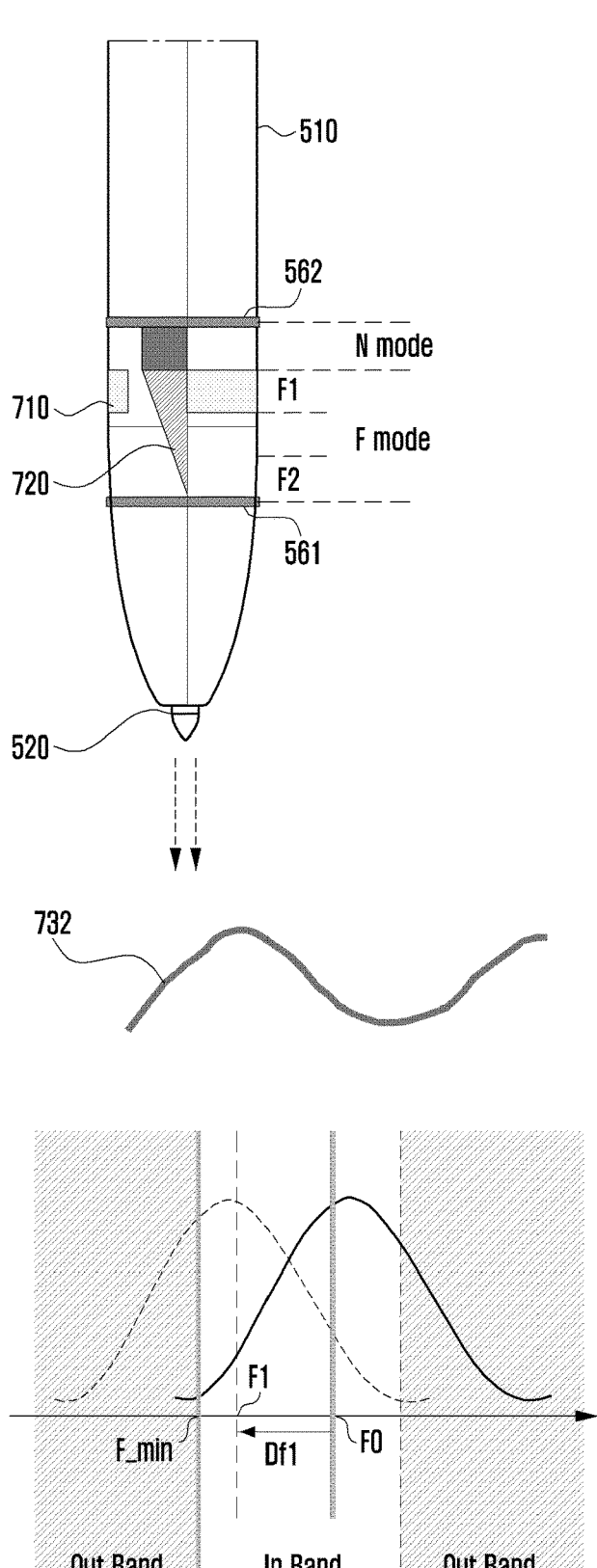
Figure 7C:
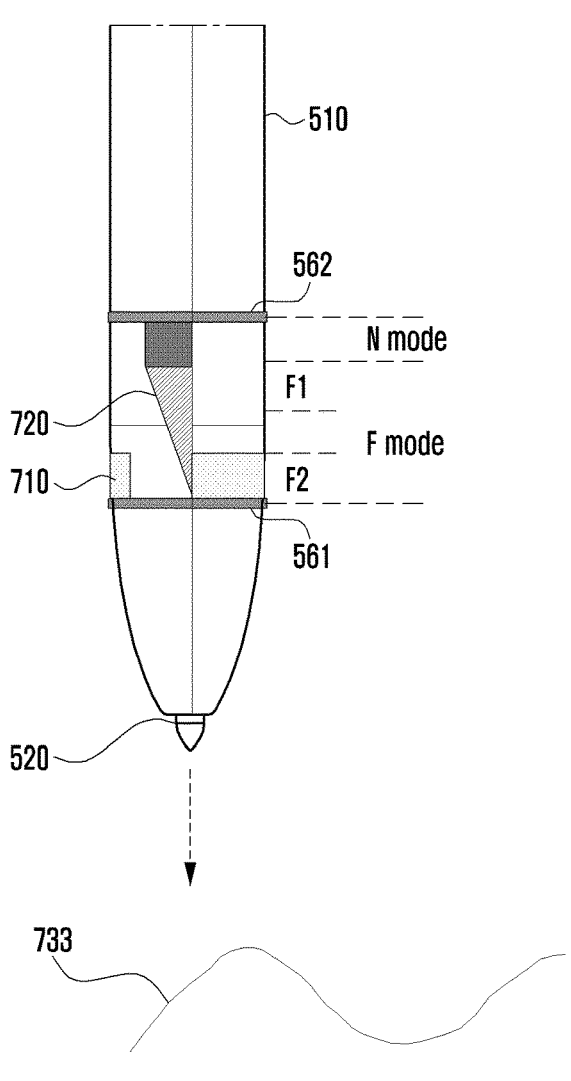
Figure 7C:
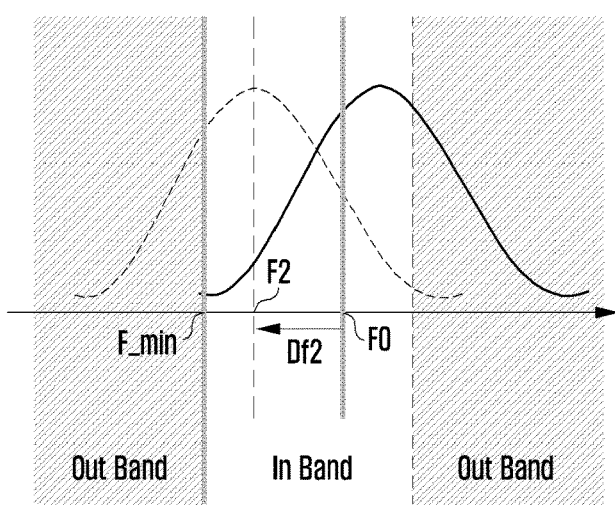

FIGS. 7A, 7B, and 7C illustrate resonant frequency variations in each mode of a control bar. FIGS. 8A, 8B, 8C, and 8D illustrate distribution graphs of pen pressure in each mode. FIG. 9 is a graph showing changes in pen pressure to load in each mode.

Referring to FIGS. 7A, 7B, and 7C, an indicator 720 may be formed between the stoppers 561 and 562 to inform a user that the thickness of pen writing is adjustable according to the change in the position of a control bar 710. For example, when seen in the drawing, the indicator 720 may be a print or an intaglio pattern indicating that the control bar 710 becomes thinner as the control bar 710 goes down from the top (the second stopper 562) to the bottom (the first stopper 561). The control bar 710 may be a structure surrounding the circumference between the stoppers 561 and 562 by less than one turn. Accordingly, even if the mode of the control bar 710 is switched, the indicator 720 may be exposed without being covered by the control bar 710 through the open portion. An in-band may be defined as a frequency band in which the digital pen 500 operates. An out-band may be defined as a frequency band that is out of the in-band frequency band. For example, the in-band frequency band may include a resonant frequency band that the input signal, which is produced by the resonant circuit 540, may have. F_min may be defined as the minimum resonant frequency that the input signal, which is produced by the resonant circuit 540, may have. The input signal reception device (e.g., the electronic device 101 in FIG. 1) may recognize an input signal having F_min as an input signal corresponding to the maximum pen pressure. A frequency band smaller than F_min may be included in the out-band. F0 may be defined as a resonant frequency (e.g., about 562.5 KHz) indicating a state in which no load is applied to the pen tip 520. For example, the input signal reception device may recognize an input signal having F0 as a hovering input signal in which the pen tip 520 does not touch the touch screen and is floating in the air. F_turn on (not shown) may be a frequency between F_min and F0 and be defined as a resonant frequency having a minimum pen pressure. That is, the input signal reception device may recognize that the pen tip 520 is in contact with the touch screen from the input signal having F_turn on.

Referring to FIG. 7A, a user may write on the touch screen by placing the control bar 710 in the N mode in which the control bar does not cover the coil 541 (e.g., a position in contact with the second stopper 562). The input signal reception device may monitor the resonant frequency of the input signal received from the digital pen 500 to recognize that the resonant frequency of the input signal changes from F0 to F_min. The input signal reception device may display a first line 731 having the maximum thickness on the screen based on a frequency variation Df (F0–F_min).

Referring to FIG. 7B, a user may write on the touch screen after moving the control bar 710 from the first position (N mode) to the second position adjacent to the N mode (hereinafter, referred to as F1 mode) in an F mode section. Assuming that the same load (i.e., pen pressure) is applied to the pen tip 500, the variation in resonant frequency may be smaller in the F1 mode than in the N mode. For example, the frequency variation may be Df1 (=F0–F1) which is smaller than Df. The input signal reception device may display a second line 732 that is thinner than the first line 731 on the screen based on the frequency variation Df1.

Referring to FIG. 7C, a user may write on the touch screen after moving the control bar 710 to a third position (hereinafter, referred to as F2 mode) where the control bar is in contact with the first stopper 561 in the F mode section. Assuming that the same load is applied to the pen tip 500, the variation in resonant frequency may be smaller in the F2 mode than in the F1 mode. For example, the frequency variation may be Df2 (=F0–F2) which is less than Df1. The input signal reception device may display a third line 733 that is thinner than the second line 732 on the screen based on the frequency variation amount Df2.

Figure 8A:
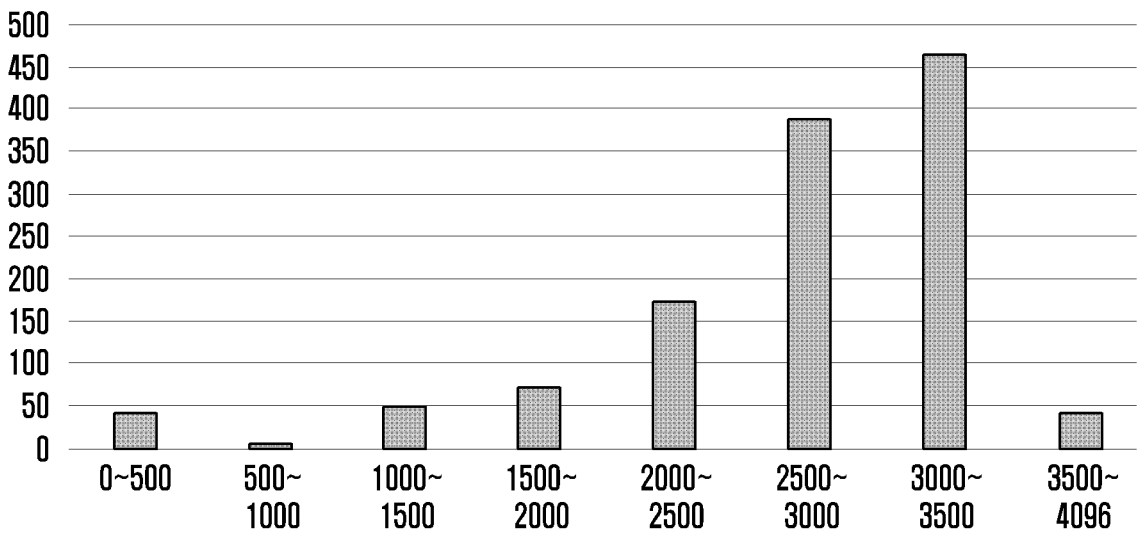
FIGS. 8A, 8B, 8C, and 8D illustrate distribution graphs of pen pressure in each mode.
Figure 8B:
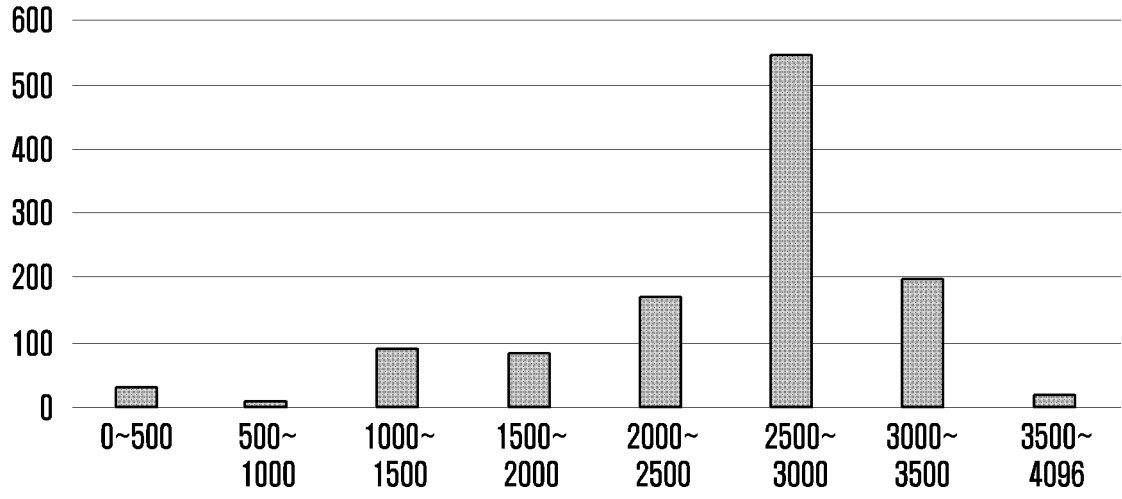
Figure 8C:
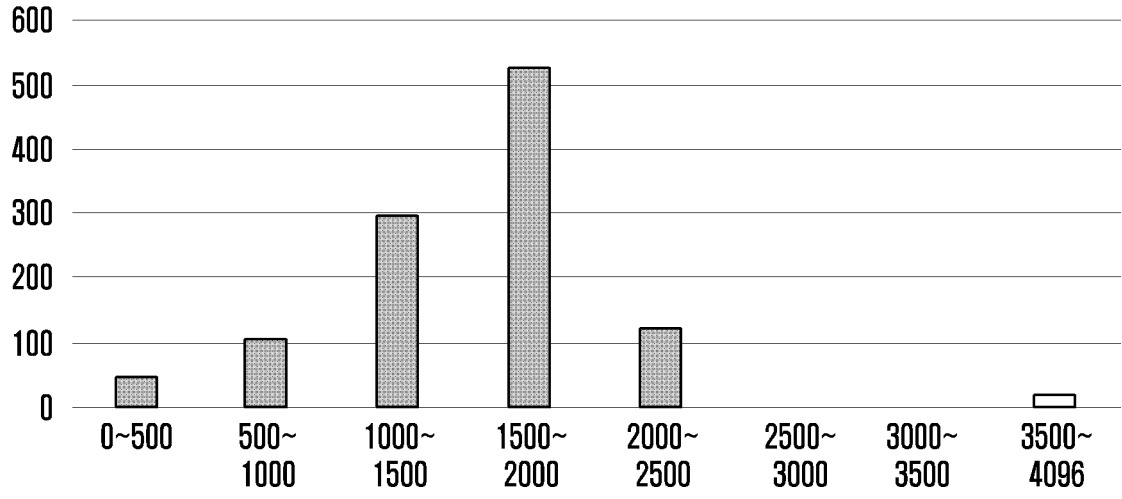
Figure 8D:
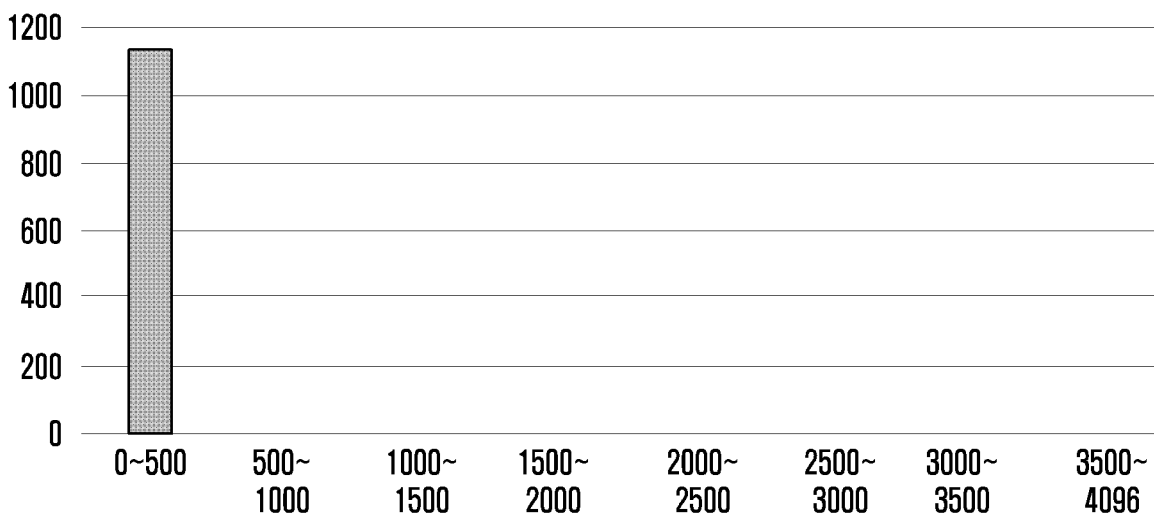
Figure 9:
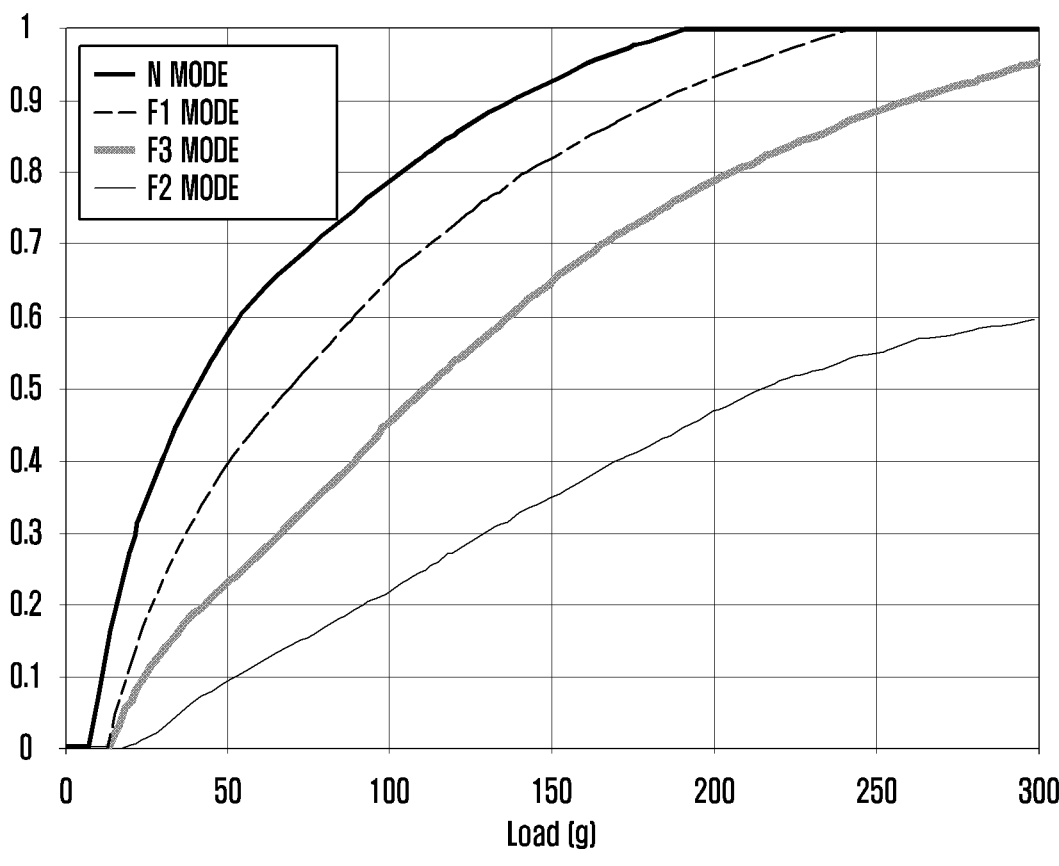
FIG. 9 is a graph showing changes in pen pressure to load in each mode.

Referring to FIG. 8A, when the digital pen 500 operates in the N mode, the pen pressure distribution measured by the input signal reception device may be formed high. Unlike a user's expectations, a line and writing may not be expressed thinly Referring to FIG. 8B, the pen pressure distribution in the F1 mode may be relatively lower than that in the N mode. Referring to FIG. 8C, the pen pressure distribution in the intermediate mode (F3 mode) between the F1 mode and the F2 mode may be relatively lower than that in the F1 mode. Referring to FIG. 8D, the pen pressure distribution may be formed to be the lowest in the F2 mode. Contrary to a user's expectations, a line or writing may not be expressed thickly. If the writing seems to be thicker than expected, the user may switch the operation mode of the digital pen 500 from the N mode to the F (F1, F2, or F3 which is between F1 and F2) mode.

Referring to FIG. 9, the change in pen pressure in each mode may be identified as a pressure curve. In the N mode, the pen pressure may rise rapidly when the load (the weight applied to the pen tip 520) is less than or equal to a predetermined level (e.g., 50 g). Accordingly, it may be difficult to express fine thickness in the N mode. When the mode is switched to the F mode, the change in pressure relative to the change in load may be linear and gentle. Accordingly, a more detailed expression of thickness may be possible in the F mode.

Figure 10A:
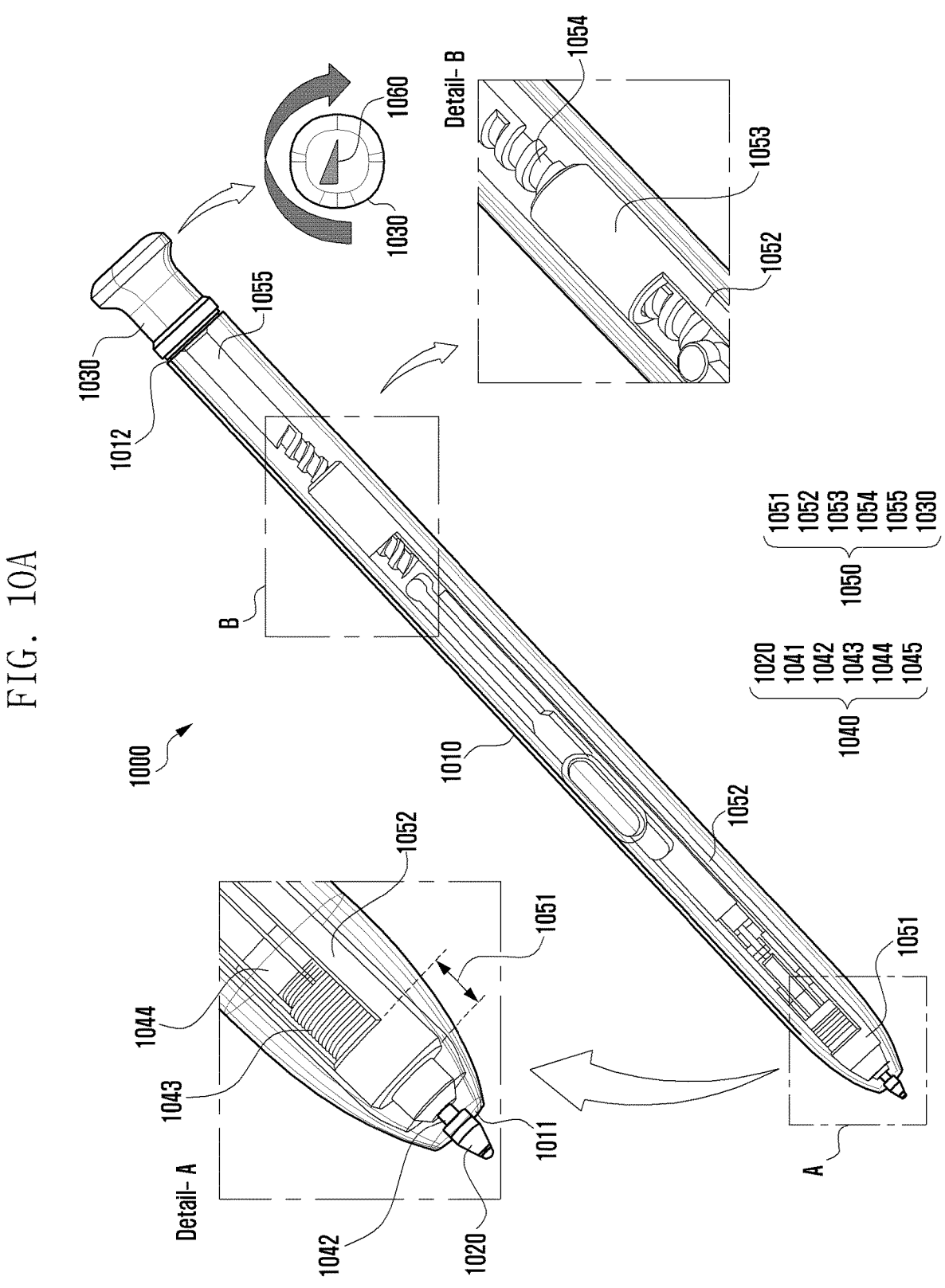
FIGS. 10A, 10B, 10C, and 10D show a digital pen having a structure configured to adjust the position of a control bar using a rotation lever, according to an embodiment.
Figure 10B:
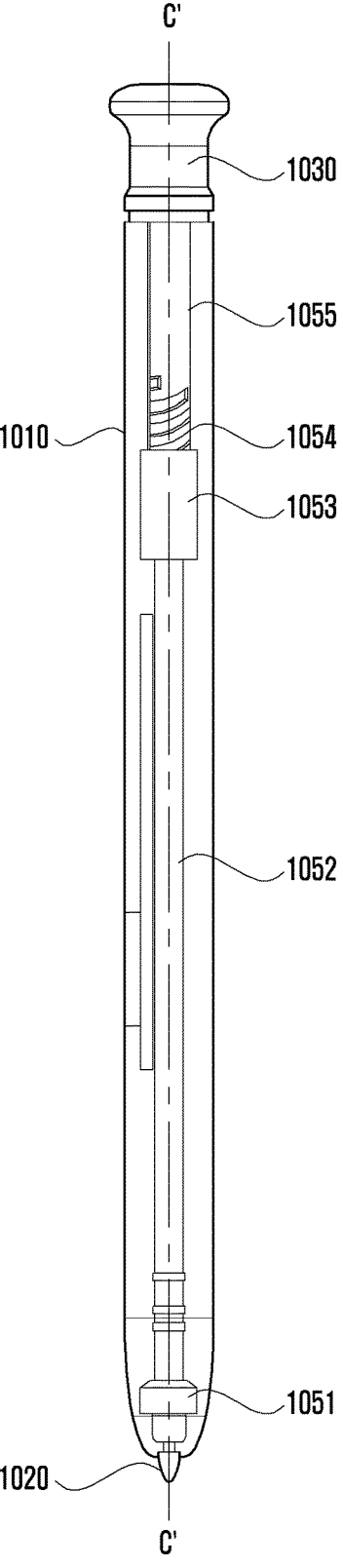
Figure 10C:
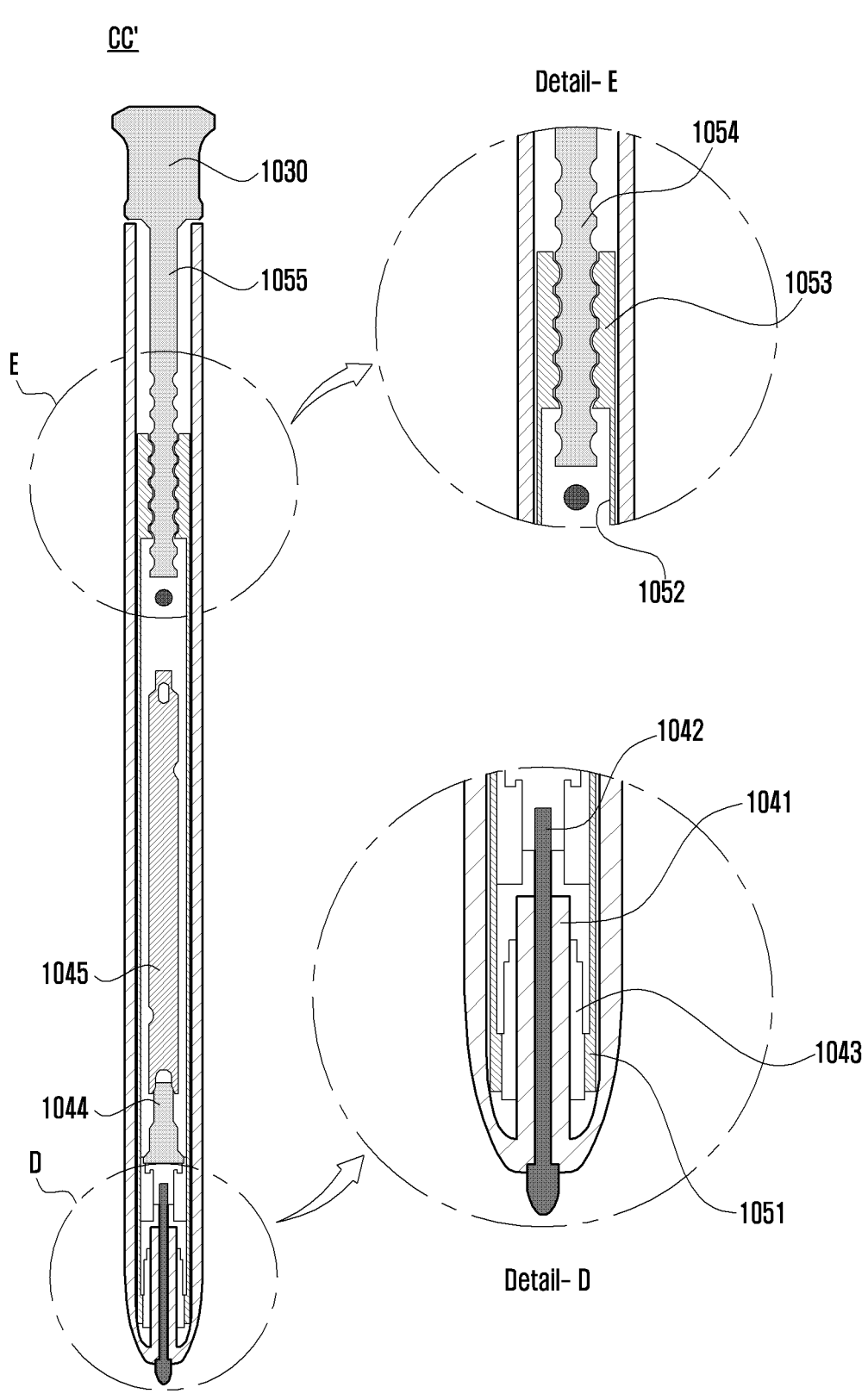
Figure 10D:
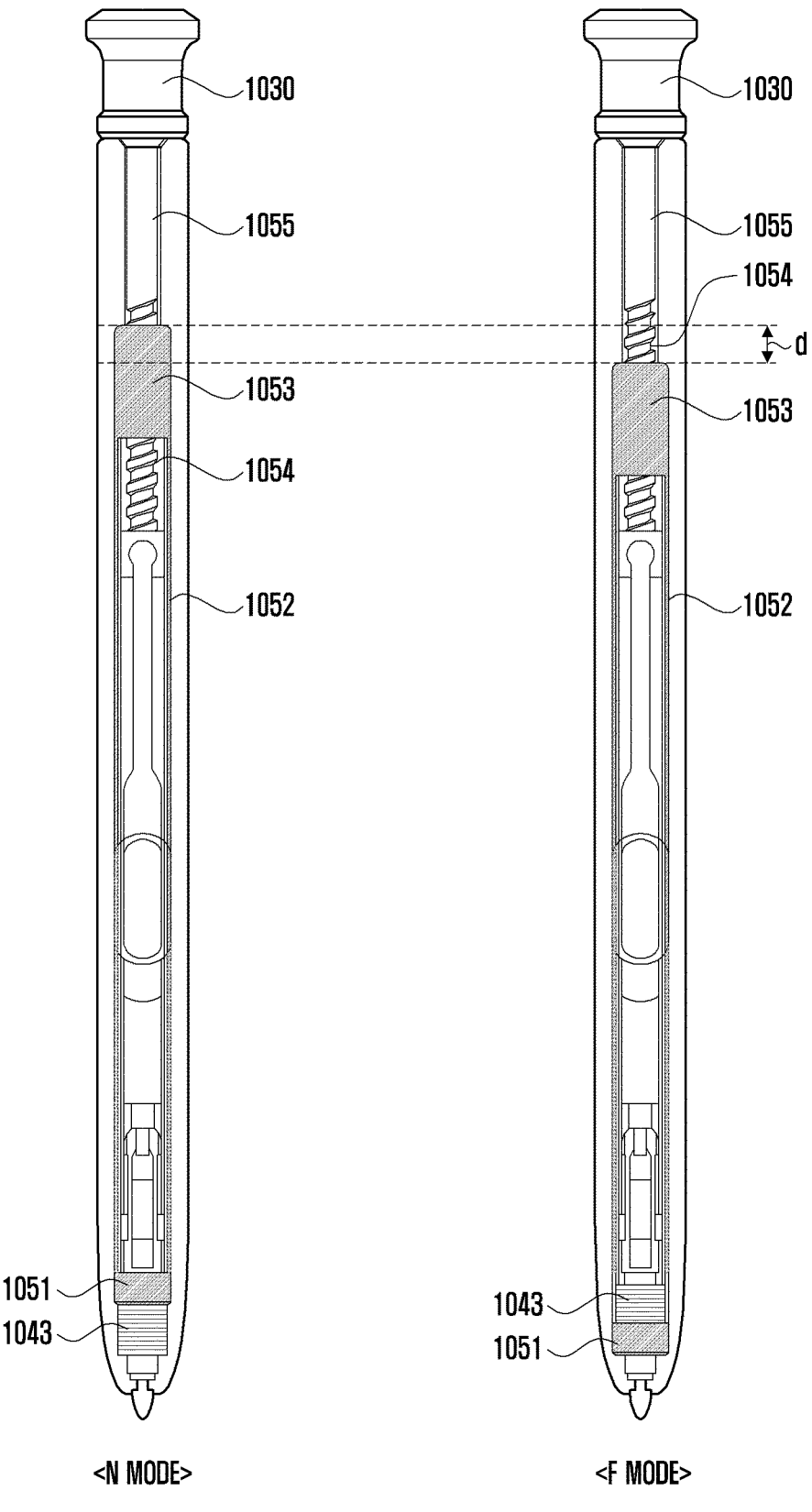

FIGS. 10A, 10B, 10C, and 10D show a digital pen having a structure configured to adjust the position of a control bar using a rotation lever, according to an embodiment. Specifically, FIGS. 10A and 10B are diagrams illustrating a housing of a digital pen and an assembly mounted therein. FIG. 10C is a cross sectional view of the digital pen shown in FIG. 10B, taken along a CC' direction. FIG. 10D is a diagram illustrating a position change of a control bar.

Referring to FIGS. 10A, 10B, and 10C, a digital pen 1000 (e.g., the input module 150) may include a housing 1010, a pen tip 1020 exposed through one end 1011 of the housing 1010, a rotation lever 1030 disposed at the other end 1012 of the housing 1010, and an assembly corresponding to the shape of the housing 1010 and having a shape extending straight from one end 1011 of the housing 1010 through the inside of the housing 1010 to the other end 1012 of the housing 1010. The assembly may be largely divided into an input signal production member 1040 and a resonant frequency adjustment member 1050.

The input signal production member 1040 may include the pen tip 1020, a core 1041 made of metal (e.g., ferrite), a rod 1042 extending straight from the pen tip 1020 to the other end 1012 through a hole formed inside the core 1041, a coil 1043 wound around the outer circumference of the core 1041 about the core 1041, a pressure sensor 1044 (e.g., the variable capacitor 543 of FIG. 5), and a PCB 1045. A resonant circuit (e.g., the resonant circuit 540 of FIG. 5) may be mounted on the PCB 1045. The input signal production member 1040 may have the same configuration as the first assembly member 410 and the third assembly member 430 of FIG. 4, and a detailed description thereof will be omitted.

The resonant frequency adjustment member 1050 may be a structure configured to adjust the resonant frequency of an input signal output to the outside via the coil 1043. According to an embodiment, the resonant frequency adjustment member 1050 may include a control bar 1051, a joint member 1052, a nut portion 1053, a bolt portion 1054, a shaft 1055, and a rotation lever 1030. The control bar 1051 may be a shape of a ring surrounding the coil 1043, and at least a part of the control bar may be made of metal. The joint member 1052 may be made of an injection material and may extend from the control bar 1051 toward the other end 1012. The nut portion 1053 may be made of an injection material or metal, may extend from the joint member 1052 toward the other end 1012, and may have a female screw formed in the cylindrical inside thereof. The bolt portion 1054 may be implemented with an injection material or metal, and a male screw may be formed on the cylindrical outer wall to be screw-coupled to the nut portion 1053. The shaft 1055 may extend from the bolt portion 1054 toward the other end 1012 and be coupled to the rotation lever 1030. Referring to FIG. 10A, an indicator 1060 indicating a direction in which the thickness of pen writing is thinned (e.g., clockwise) may be formed (e.g., printed) on the surface of the rotation lever 1030.

Referring to FIG. 10D, a user may change the position of the control bar 1051 by turning the rotation lever 1030. For example, if the control bar 1051 is located in a position (N mode) where the control bar does not cover the coil 1043 and the user turns the rotation lever 1030 clockwise in this state, the rotational force may be transmitted to the bolt portion 1054 via the shaft 1055. By the rotation of the bolt portion 1054, the nut portion 1053 may vertically move downward by a distance d, as shown in the drawing. The control bar 1051 extending from the nut portion 1053 via the joint member 1052 may also vertically move downward by a distanced. Via rotation of the rotation lever 1030, the control bar 1051 may move to a position (F mode) where the control bar surrounds a part of the coil 1043. In addition, by reverse rotation of the rotation lever 1030, the control bar 1051 may switch the mode from the F mode to the N mode. According to one embodiment, the digital pen 1000 may include a forward-backward button in place of the rotary lever 1030. By pressing the forward-backward button, the user can reposition the control bar 1051.

In various embodiments, a digital pen (e.g., the digital pen 201) may include: a housing, a pen tip exposed to the outside through an end of the housing, a rod extending from the pen tip into the housing along a longitudinal axis extending from the one end of the housing to the other end thereof, a resonant circuit and a control bar. The resonant circuit includes a coil received inside the housing, wound multiple times around the longitudinal axis in a direction in which the longitudinal axis extends, and producing an electric current by a first magnetic field signal from the outside, a resonant capacitor configured to accumulate an electric charge by the electric current produced in the coil, and to discharge the accumulated electric charge to the coil such that the coil produces a second magnetic field signal, and a variable capacitor configured to change the resonant frequency of the second magnetic field signal produced by the coil according to the pressure transferred from the pen tip via the rod. The control bar is shaped to surround the longitudinal axis, is movable from a first position at which the control bar does not surround the coil to a second position at which the control bar surrounds at least a part of the coil, and includes a metallic part to change the resonant frequency of the second magnetic field signal produced by the coil.

The control bar may be a shape of a ring surrounding the outer circumference of the housing.

The control bar fits tightly around the housing to resist movement.

The digital pen may further include a first stopper and a second stopper to limit a movement range of the control bar.

The first stopper and the second stopper protrude from the outer circumference of the housing.

The first stopper may be aligned to be parallel with an end of the coil. When the second stopper is in contact with the control bar, the second stopper may escape from the other end of the coil and be located at a position at which the control bar does not surround the coil.

An indicator, which guides a user that the thickness of pen writing is adjusted according to the change in the position of the control bar, may be formed within the movement range.

In order to prevent the indicator from being covered by the control bar and be exposed, the control bar may have an opening.

The control bar may be received inside the housing, have a ring shape to surround the coil, and include a joint member extending from the control bar, a nut portion extending from the joint member and having a female screw formed on an inner cylindrical wall, a bolt portion having a male screw formed on an outer cylindrical wall to be screw-coupled to the nut portion, a shaft extending from the bolt portion, and a rotation lever coupled to the shaft and rotatable to rotate the shaft in forward and reverse directions to push and pull the control bar.

In various embodiments, a portable electronic device (e.g., the electronic device 101 of FIG. 1) may include: the digital pen, a housing having a space configured to receive the digital pen, a sensor panel configured to produce a first magnetic field signal and receive a second magnetic field signal from the digital pen, and a processor configured to obtain a pressure, based on the resonant frequency of the second magnetic field signal received from the digital pen via the sensor panel.

The embodiments of the disclosure disclosed in the specification and drawings are only presented as specific examples to easily explain the technical content according to the embodiments of the disclosure and help understanding of the embodiments of the disclosure, and are not intended to limit the scope of the embodiments of the disclosure. Therefore, the scope of various embodiments of the disclosure should be construed to include all changes or modifications derived based on the technical idea of various embodiments of the disclosure, in addition to the embodiments disclosed herein, in the scope of various embodiments of the disclosure.

Figure 11:
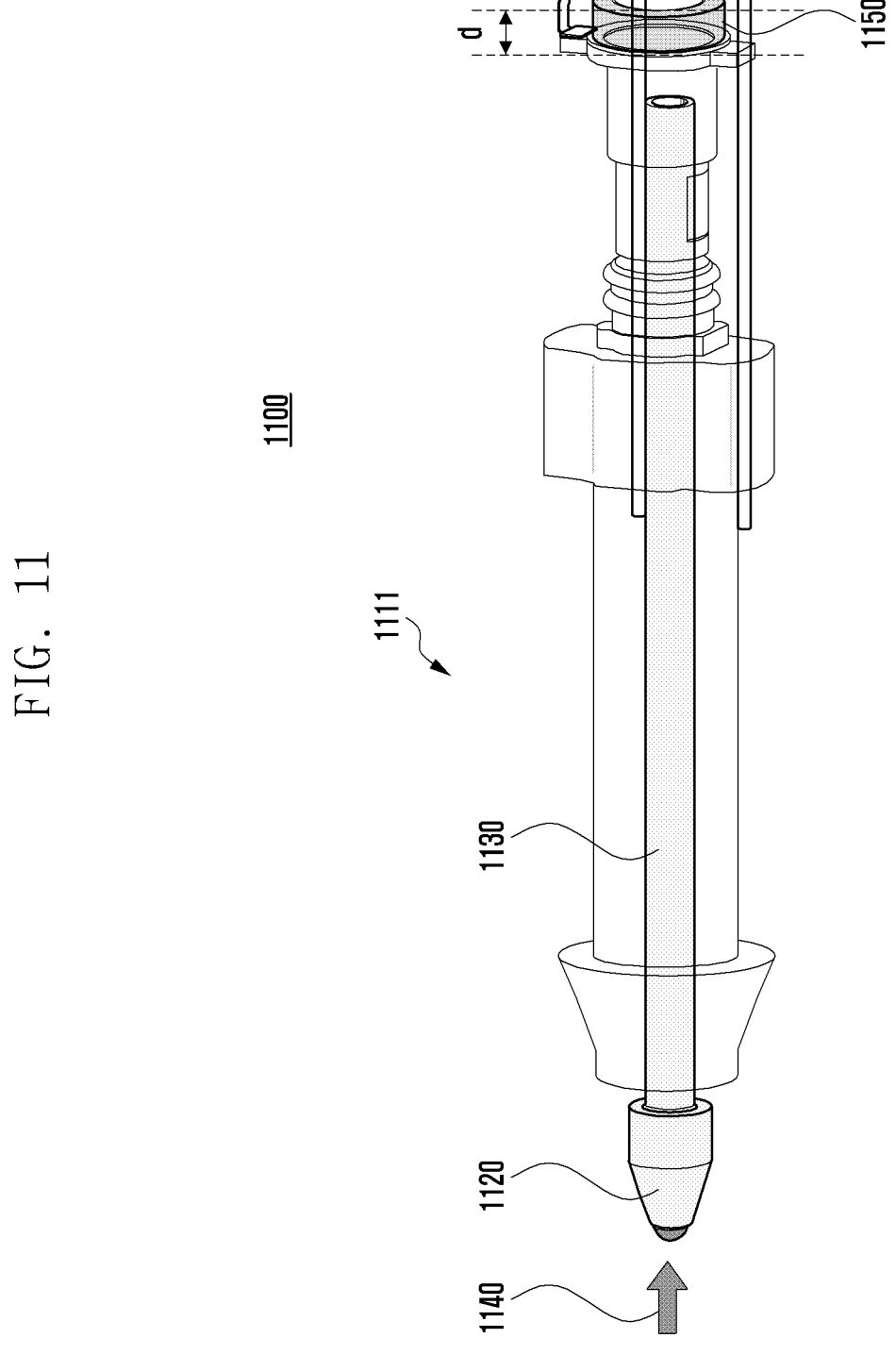
FIG. 11 illustrates a digital pen according to an embodiment.

FIG. 11 shows a digital pen 1100, according to an embodiment. Referring to FIG. 11, the digital pen 1100 (e.g., the digital pen 500) may include a housing 1111, a pen tip 1120 exposed to the outside via one end of the housing 1111, a rod 1130 extending from the pen tip 1120 into the housing along a longitudinal axis extending from one end of the housing 1111 to the other end thereof, a resonant circuit (e.g., the resonant circuit 540) received inside the housing 1111, and a control bar (e.g., the control bar 550) which surrounds the housing 1111 around the axis connecting one end and the other end, is movable along the axis, and has at least a portion made of metal. When pressure 1140 is applied to the pen tip 1120, the distance between the electrodes of the capacitor 1150 may be changed in the resonance circuit, and accordingly, the capacitance of the capacitor 1150 may be changed. Such a change in capacitance may cause a change in the resonant frequency of an input signal output from the digital pen 1100 to the outside.

Figure 12A:
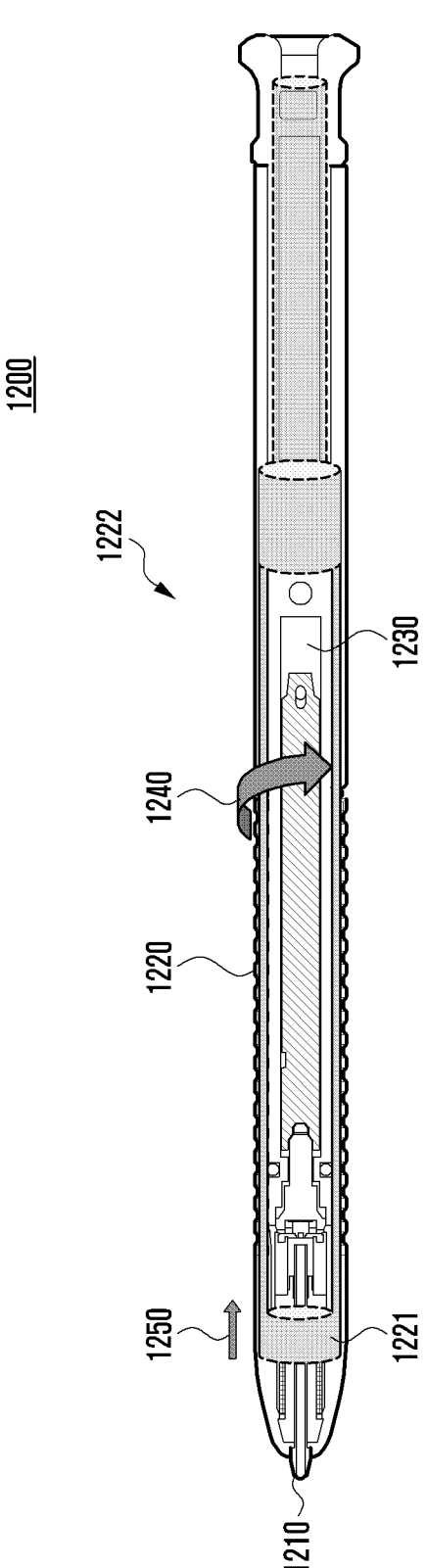
FIGS. 12A and 12B show a digital pen having a structure configured to adjust the position of a control bar using a rotation lever according to embodiments.
Figure 12B:
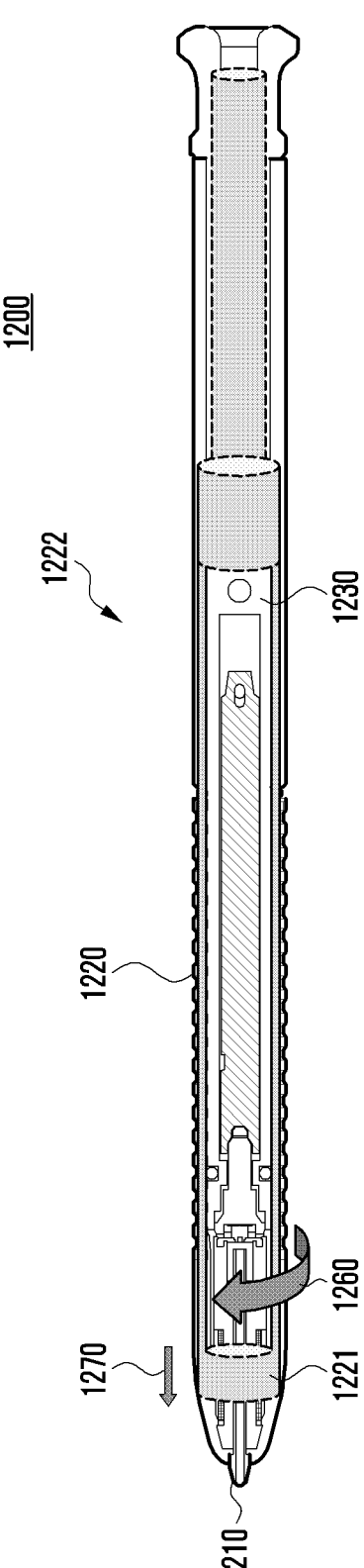

FIGS. 12A and 12B show a digital pen having a structure configured to adjust the position of a control bar using a rotation lever, according to an embodiment. Referring to FIGS. 12A and 12B, a digital pen 1200 (e.g., the digital pen 500) may include a housing 1222, a pen tip 1210 exposed via one end of the housing 1222, and an assembly 1030 disposed on the housing 1222 (e.g., the input signal production member 1040 and the resonant frequency adjustment member 1050). The assembly 1230 may include a rotation lever 1220 configured to surround a portion of the housing 1222. When the rotation lever 1220 rotates in the clockwise direction 1240 (FIG. 12A), a control bar 1221 located inside the housing 1222 may move in one direction 1250 corresponding to the rotation. When the rotation lever 1220 rotates in the counterclockwise direction 1260, the control bar may move in the opposite direction 1070 corresponding to the rotation. The control bar 1221 may be integrally implemented with the rotation lever 1220.

Figure 13A:
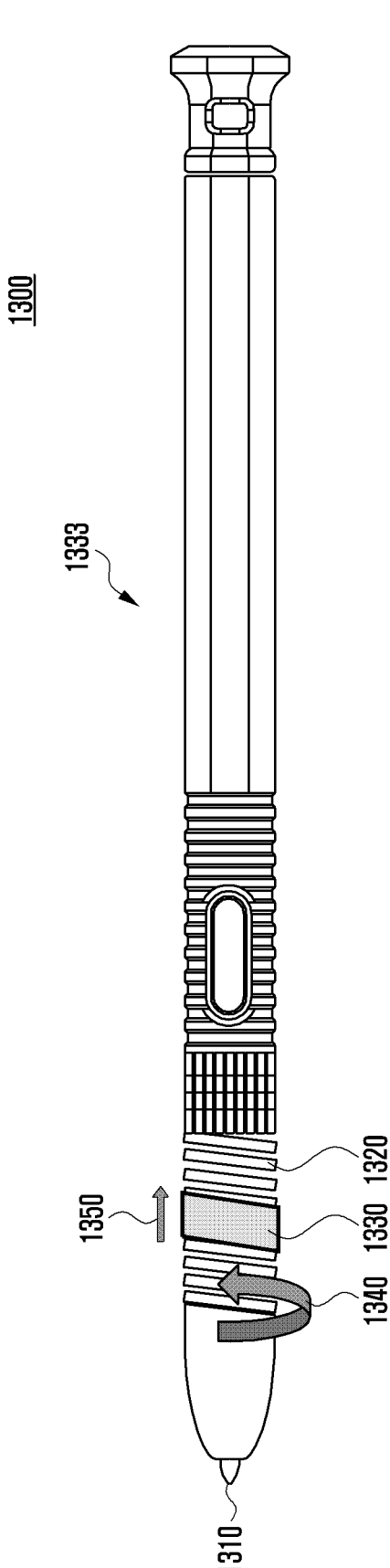
FIGS. 13A and 13B show a digital pen having a structure configured to adjust the position of a control bar by using a screw hole according to embodiments.
Figure 13B:
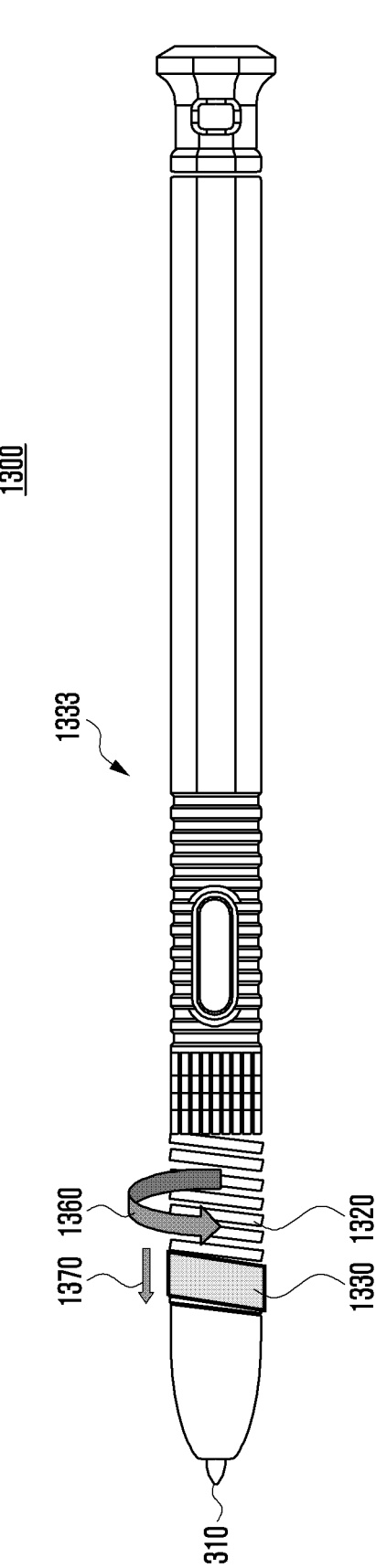

FIGS. 13A and 13B show a digital pen having a structure configured to adjust the position of a control bar by using a screw hole. Referring to FIGS. 13A and 13B, a digital pen 1300 (e.g., the digital pen 500) may include a housing 1333, a pen tip 1310 exposed via one end of the housing 1333, a control bar 1320 surrounding a portion of the housing 1333, and an assembly (e.g., the input signal production member 1040 and a resonant frequency adjustment member 1050) disposed inside the housing 1333. A screw hole 1320 may be configured to be formed outside the housing 1333, and the control bar 1330 may be configured to be screw-coupled to the screw hole 1320. Accordingly, when the control bar 1330 is rotated in the counterclockwise direction 1340, the control bar 1330 may move in one direction 1350 (FIG. 13A) on the housing 1333 corresponding to the rotation. When the control bar 1320 is rotated in the clockwise direction 1360, the control bar 1320 may move in the other direction 1370 (FIG. 13B) on the housing 1333 corresponding to the rotation.

Figure 14A:
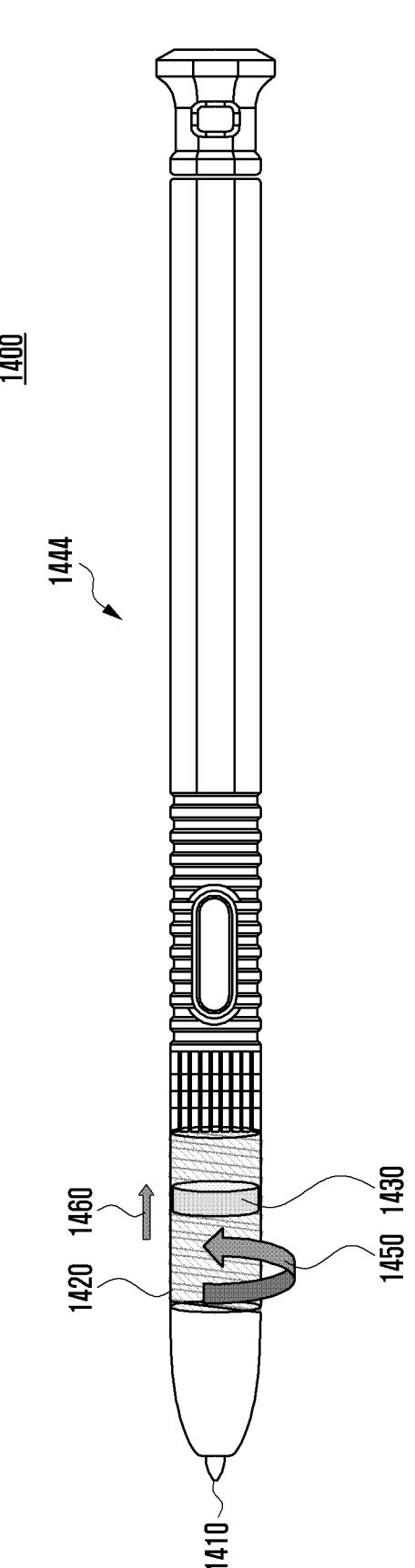
FIGS. 14A and 14B show a digital pen having a detachable control bar according to embodiments.
Figure 14B:
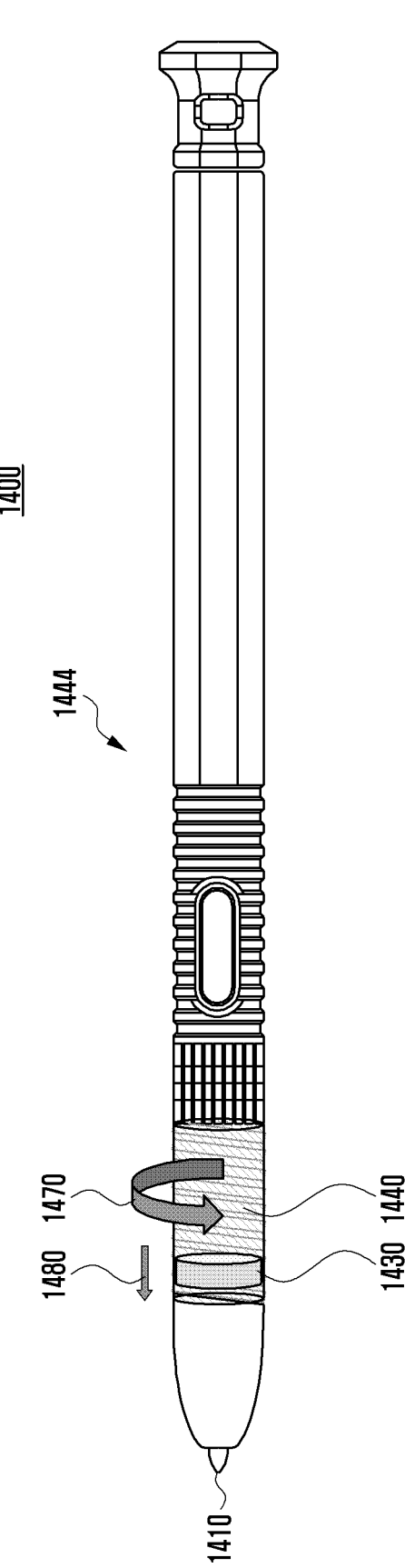

FIGS. 14A and 14B show a digital pen having a detachable control bar. Referring to FIGS. 14A and 14B, a digital pen 1400 may include a housing 1444, a pen tip 1410 exposed via one end of the housing 1444, a holder 1420, a control bar 1430, and an assembly (e.g., the input signal production member 1040 and the resonant frequency adjustment member 1050) disposed inside the housing 1444. The holder 1420 may be configured to surround a portion of the housing 1444. The control bar 1430 may be formed on the holder 1420 and may be separated from the housing 1444 along with the holder 1420. A screw hole may be formed through the holder 1420, and thus the control bar 1430 and the holder may be screw-coupled to each other. Accordingly, when the control bar 1430 is rotated in a counterclockwise direction 1450, the control bar 1430 may move in one direction 1460 (FIG. 14A) on the holder 1420 corresponding to the rotation. When the control bar 1430 is rotated in the clockwise direction 1470, the control bar 1430 may move in the other direction 1480 (FIG. 14B) on the holder 1420 corresponding to the rotation.

According to an embodiment, a digital pen (e.g., the digital pen 201 of FIGS. 2 and 3) may include a housing (e.g., the housing 110 of FIG. 2), a pen tip exposed via one end of the housing, a control bar which is movable along the housing, and a processor 320. The processor 320 may produce virtual writing when the pen tip moves along a surface. The processor 320 may obtain a pen writing thickness based on pressure when the pen tip presses against the surface. The processor 320 may obtain the thickness of the pen text further based on the position of the control bar. The control bar may be tightly fitted around the housing. The housing may include a first stopper and a second stopper arranged to limit a movement range of the control bar. The control bar may be moved along the housing by a user's physical manipulation. The control bar may be moved along the housing by electromagnetic force. The control bar may be moved along the housing by remote control. For example, the digital pen may further include a driving circuit configured to adjust the position of the control bar. For example, the driving circuit may include a motor. The processor 320 may receive a control signal from the electronic device 101 via the communication circuit 390 (e.g., a Bluetooth communication circuit) and may adjust the position of the control bar based on the received control signal. The processor 320 may receive data indicating the pen pressure from the electronic device 101 via the communication circuit 390 (e.g., a Bluetooth communication circuit), and may obtain the pen writing thickness based on the received data.

The invention claimed is:

1. A digital pen comprising:
   a housing;
   a pen tip exposed through an end of the housing;
   a rod extending from the pen tip into the housing;
   a resonant circuit comprising:
   a coil wound multiple times around a longitudinal axis of the rod and producing an electric current by a first magnetic field signal;
   a resonant capacitor configured to accumulate an electric charge by the electric current produced in the coil and to discharge the accumulated electric charge to the coil such that the coil produces a second magnetic field signal; and
   a variable capacitor configured to change a resonant frequency of the second magnetic field signal according to pressure transferred from the pen tip via the rod; and a control bar movable from a first position at which the control bar does not surround the coil to a second position at which the control bar surrounds at least a part of the coil and comprising a metallic part to change the resonant frequency of the second magnetic field signal.

2. The digital pen of claim 1, wherein the control bar has a shape of a ring surrounding the housing.

3. The digital pen of claim 2, wherein the control bar fits tightly around the housing to resist movement.

4. The digital pen of claim 1, further comprising a first stopper and a second stopper limiting a movement range of the control bar.

5. The digital pen of claim 4, wherein the first stopper and the second stopper protrude from an outer circumference of the housing.

6. The digital pen of claim 5, wherein the first stopper is aligned with an end of the coil, and wherein, in case the second stopper contacts the control bar, the second stopper is located at a position at which the control bar does not surround the coil.

7. The digital pen of claim 4, further comprising an indicator, which guides a user as to a thickness of pen writing being adjusted according to a change in position of the control bar, and which is formed within a movement range of the control bar.

8. The digital pen of claim 7, wherein the control bar has an opening to expose the indicator.

9. The digital pen of claim 1, wherein the control bar is received inside the housing, has a ring shape to surround the coil, and comprises:

a joint member extending from the control bar;

a nut portion extending from the joint member and having a female screw formed on an inner cylindrical wall;

a bolt portion having a male screw formed on an outer cylindrical wall to be screw-coupled to the nut portion;

a shaft extending from the bolt portion; and a rotation lever coupled to the shaft and rotatable to rotate the shaft in forward and reverse directions to push and pull the control bar.

10. A portable electronic device comprising:

a digital pen;

a housing having a space receptive of the digital pen;

a sensor panel configured to produce a first magnetic field signal and to receive a second magnetic field signal from the digital pen; and a processor configured to obtain a pressure, based on a resonant frequency of the second magnetic field signal received from the digital pen via the sensor panel, wherein the digital pen comprises:

a pen housing;

a pen tip exposed through an end of the pen housing;

a rod extending from the pen tip into the pen housing along a longitudinal axis extending from the end of the pen housing to another end thereof;

a resonant circuit comprising:

a coil wound multiple times around the longitudinal axis and producing an electric current by a first magnetic field signal output from the sensor panel;

a resonant capacitor configured to accumulate an electric charge by the electric current and to discharge the accumulated electric charge to the coil such that the coil produces the second magnetic field signal; and a variable capacitor configured to change the resonant frequency of the second magnetic field signal according to the pressure; and a control bar movable from a first position at which the control bar does not surround the coil to a second position at which the control bar surrounds at least a part of the coil and comprising a metallic part to change the resonant frequency of the second magnetic field.

11. The portable electronic device of claim 10, wherein the control bar has a shape of a ring surrounding the pen housing.

12. The portable electronic device of claim 10, further comprising a first stopper and a second stopper to limit a movement range of the control bar.

13. The portable electronic device of claim 12, wherein the first stopper and the second stopper protrude from an outer circumference of the pen housing.

14. The portable electronic device of claim 12, further comprising an indicator which guides a user as to a thickness of pen writing being adjusted according to a change in a position of the control bar.

15. The portable electronic device of claim 10, wherein the control bar is received inside the pen housing, has a ring shape to surround the coil, and comprises:

a joint member extending from the control bar;

a nut portion extending from the joint member and having a female screw formed on an inner cylindrical wall;

a bolt portion having a male screw formed on an outer cylindrical wall to be screw-coupled to the nut portion;

a shaft extending from the bolt portion; and a rotation lever coupled to the shaft and rotatable to rotate the shaft in forward and reverse directions to push and pull the control bar.

* * * * *